(12) United States Patent
Onozawa et al.

(10) Patent No.: US 9,054,154 B2
(45) Date of Patent: Jun. 9, 2015

(54) SEMICONDUCTOR DEVICE

(71) Applicant: FUJI ELECTRIC CO., LTD., Kawasaki-shi (JP)

(72) Inventors: Yuichi Onozawa, Matsumoto (JP); Hidenori Takahashi, Matsumoto (JP); Takashi Yoshimura, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/449,984

(22) Filed: Aug. 1, 2014

(65) Prior Publication Data
US 2014/0339599 A1 Nov. 20, 2014

Related U.S. Application Data

(63) Continuation of application No. PCT/JP2013/077862, filed on Oct. 11, 2013.

(30) Foreign Application Priority Data

Oct. 17, 2012 (JP) .................................. 2012-229971

(51) Int. Cl.
*H01L 29/739* (2006.01)
*H01L 29/423* (2006.01)
(Continued)

(52) U.S. Cl.
CPC ........ *H01L 29/7397* (2013.01); *H01L 29/4236* (2013.01); *H01L 29/4238* (2013.01);
(Continued)

(58) Field of Classification Search
CPC ..................... H01L 29/1095; H01L 29/42304; H01L 29/41708; H01L 29/7397

USPC .......................................... 257/139, 330, 565
See application file for complete search history.

(56) References Cited

U.S. PATENT DOCUMENTS

| 5,329,142 A | 7/1994 | Kitagawa et al. |
| 5,998,833 A | 12/1999 | Baliga |

(Continued)

FOREIGN PATENT DOCUMENTS

| JP | 05-243561 A | 9/1993 |
| JP | 2001-308327 A | 11/2001 |

(Continued)

OTHER PUBLICATIONS

International Search Report issued in PCT/JP2013/077862. dated Dec. 24, 2013.

(Continued)

*Primary Examiner* — Christine Enad
(74) *Attorney, Agent, or Firm* — Rossi, Kimms & McDowell LLP

(57) ABSTRACT

A semiconductor device includes a first gate electrode that is provided on a first insulating film along one side wall of a first trench and is provided in a second trench, a shield electrode that is provided on a second insulating film along the other side wall of the first trench and is provided in a third trench, a gate runner that is an extended portion of the second trench, has a portion which is provided on the first gate electrode, and is connected to the first gate electrode, and an emitter polysilicon layer that is an extended portion of the third trench, has a portion which is provided on the shield electrode, and is connected to the shield electrode. The semiconductor device has improved turn-on characteristics with a slight increase in the number of process steps, while preventing increase in costs and reduction in yield.

16 Claims, 14 Drawing Sheets

(51) Int. Cl.
*H01L 29/66* (2006.01)
*H01L 29/10* (2006.01)
*H01L 29/417* (2006.01)
*H01L 29/49* (2006.01)

(52) U.S. Cl.
CPC ...... *H01L29/66348* (2013.01); *H01L 29/1095* (2013.01); *H01L 29/41708* (2013.01); *H01L 29/42304* (2013.01); *H01L 29/4916* (2013.01)

(56) References Cited

U.S. PATENT DOCUMENTS

| | | | |
|---|---|---|---|
| 6,815,769 B2 | 11/2004 | Pfirsch et al. | |
| 7,227,225 B2* | 6/2007 | Ono et al. | 257/331 |
| 7,633,122 B2* | 12/2009 | Otsuki | 257/331 |
| 7,719,053 B2* | 5/2010 | Nakamura | 257/330 |
| 8,319,314 B2* | 11/2012 | Ogura et al. | 257/566 |
| 2001/0054738 A1 | 12/2001 | Momota et al. | |
| 2003/0160270 A1* | 8/2003 | Pfirsch et al. | 257/288 |
| 2005/0167742 A1 | 8/2005 | Challa et al. | |
| 2005/0263852 A1* | 12/2005 | Ogura et al. | 257/565 |

FOREIGN PATENT DOCUMENTS

| | | |
|---|---|---|
| JP | 2002-528916 A | 9/2002 |
| JP | 2007-529115 A | 10/2007 |
| JP | 2010-141094 A | 6/2010 |
| JP | 2010-258005 A | 11/2010 |
| JP | 2011-014621 A | 1/2011 |

OTHER PUBLICATIONS

Masakazu Yamaguchi "IEGT Design Criterion for Reducing EMI Noise" Proceedings of 2004 International Symposium on Power Semiconductor Devices & IC's, Kitakyshu, pp. 115-118.

* cited by examiner

SEMICONDUCTOR DEVICE

BACKGROUND OF THE INVENTION

A. Field of the Invention

The present invention relates to a semiconductor device, and more particularly, to a trench gate insulated gate bipolar transistor (IGBT).

B. Description of the Related Art

A technique for reducing the power consumption of a power conversion device has been developed and there are great expectations for a technique for reducing the power consumption of a power device which plays a central role in the power conversion device. Among the power devices, an insulated gate bipolar transistor (IGBT) which can reduce an on-voltage using a conductivity modulation effect and is easily controlled by the control of a voltage-driven gate is generally used.

As a MOS gate (an insulated gate with a metal-oxide-semiconductor structure) structure of the IGBT, the following have been known: a planar gate IGBT in which a gate electrode is provided along the surface of a wafer, and a trench gate IGBT in which a polysilicon gate electrode is provided on the inner wall of a trench with a shape that extends from a stripe-shaped planar pattern on the surface of wafer in a direction perpendicular to the depth direction, with a surface oxide film interposed therebetween. In the trench gate IGBT, since a channel is formed along both inner side walls of the trench in which an opening portion is the stripe-shaped planar pattern, the opening width of the trench and the spacing of the stripe-shaped trench pattern are reduced to increase channel density to be higher than that in the planar gate IGBT. When the channel density is increased, it is possible to further reduce the on-voltage. Therefore, in recent years, the use of the trench gate IGBT has increased.

Next, the structure of a general trench gate IGBT will be described. FIG. 8 is a cross-sectional view illustrating a trench gate IGBT with a floating potential region according to the related art. In FIG. 8, a p layer 112 including a p base region 103 and a floating p region 111 is formed in a surface layer of the front surface (close to an $n^-$ drift layer 102) of a silicon substrate in which the $n^-$ drift layer 102 is formed on the front surface of a $p^+$ silicon substrate that will be a $p^+$ collector region 101. The p layer 112 is divided into the p base region 103 and the floating p region 111 by a plurality of trenches 110 which extend from the front surface of the silicon substrate to the $n^-$ drift layer 102 through the p layer 112.

The p base region 103 is interposed between the side walls, which are close to a portion of the p layer 112 in which the $n^+$ emitter region 104 is provided, of the adjacent trench 110. Since a main current flows in the region that is interposed between the side walls, which are close to the portion in which the $n^+$ emitter region 104 is provided, of adjacent trenches 110, the region is also referred to as an active mesa region. The floating p region 111 is interposed between the side walls, which are close to a portion of the p layer 112 in which the $n^+$ emitter region 104 is not provided, of adjacent trenches 110. The floating p region 111 is insulated from the $n^-$ drift layer 102 by a pn junction with the $n^-$ drift layer 102 and is insulated from a gate electrode 106 by a gate insulating film 105. That is, the floating p region 111 is in a so-called floating state (floating region).

The gate electrode 106 is provided on the inner wall of the trench 110, with the gate insulating film 105 interposed therebetween. The $n^+$ emitter region 104 comes into contact with the gate insulating film 105 provided on the side wall of the trench 110 which is close to the p base region 103. An emitter electrode 108 is electrically connected to the $n^+$ emitter region 104 and the p base region 103 and is insulated from the gate electrode 106 by an interlayer insulating film 107. In addition, the emitter electrode 108 is covered with a passivation film (not shown) which is a silicon nitride film ($Si_3N_4$ film), an amorphous silicon film, or a polyimide film. A collector electrode 109 comes into contact with the $p^+$ collector region 101.

Next, the operation of the IGBT shown in FIG. 8 will be described. First, an operation of changing the trench gate IGBT from an off state to an on state will be described. The emitter electrode 108 is generally connected to the earth. When the voltage of the gate electrode 106 is lower than a threshold value, with a voltage higher than that of the emitter electrode 108 being applied to the collector electrode 109, the pn junction between the p base region 103 and the $n^-$ drift layer 102 is reversely biased. Therefore, no current flows between the emitter and the collector. That is, the IGBT is turned off.

When a gate driving circuit (not shown) applies a voltage higher than the threshold value to the gate electrode 106 through a gate resistor, charge starts to be stored in the gate electrode 106. At the same time as the charge is stored in the gate electrode 106, a region, which comes into contact with the trench 110, in a portion of the p base region 103 interposed between the $n^+$ emitter region 104 and the $n^-$ drift layer 102, is reversed and an n-type channel region is formed. Then, an electron emitted from the emitter electrode 108 is injected into the $n^-$ drift layer 102 through the $n^+$ emitter region 104 and the n-type channel region.

The pn junction between the $p^+$ collector region 101 and the $n^-$ drift layer 102 is forward biased by the injected electron and a hole is injected from the collector electrode 109. Therefore, a current flows between the emitter and the collector. That is, the IGBT is turned on. A voltage drop between the emitter electrode 108 and the collector electrode 109 of the IGBT in the on state is the on-voltage.

Next, an operation of changing the IGBT from the on state to the off state will be described. First, the gate voltage between the emitter electrode 108 and the gate electrode 106 is reduced to the threshold value or less. Then, the charge stored in the gate electrode 106 is discharged to the gate driving circuit through the gate resistor. At that time, the n-type channel region returns to a p type and the channel region is removed. Therefore, the supply of electrons from the emitter electrode 108 to the $n^-$ drift layer 102 is stopped. As a result, no hole is injected from the collector electrode 109 and the electrons and holes stored in the $n^-$ drift layer 102 are respectively discharged to the collector electrode 109 and the emitter electrode 108 or they are recombined with each other to disappear. Therefore, no current flows between the emitter and the collector. That is, the IGBT is turned off.

Various improvement methods have been proposed in order to further reduce the on-voltage of the trench gate IGBT. For example, an IGBT which is called an injection enhanced gate bipolar transistor (IEGT) with limitation characteristics close to the on-voltage of a diode has been known (for example, see the JP 5-243561 (FIG. 101)). In the IEGT device, the surface of an $n^+$ emitter region and a portion of a p base region is covered and insulated by an insulating film to reduce the contact area between the $n^+$ emitter region and the p base region, and an emitter electrode.

The operation of the IEGT is basically the same as the operation of the trench gate IGBT. Holes below the $n^+$ emitter region and the p base region which are electrically insulated from the emitter electrode are less likely to be discharged to the emitter electrode when the IEGT is turned off and are stored in the regions. As a result, the carrier concentration distribution of an n⁻ drift layer is close to the carrier concentration distribution of the diode and the on-voltage is lower than the on-voltage of the general trench gate IGBT.

However, the power device requires high-speed switching characteristics in addition to a low on-voltage and an important challenge is to improve the characteristics. However, in the trench gate IGBT and the IEGT, as the density of the trench structure increases in order to reduce the on-voltage, the capacitance between the gate electrode and the emitter electrode increases and the switching characteristics deteriorate.

When the trench gate IGBT and the IEGT are changed from the off state to the on state, charge is stored in the capacitance between the gate electrode and the emitter electrode. When the trench gate IGBT and the IEGT are changed from the on state to the off state, it is necessary to discharge the charge stored in the capacitance between the gate electrode and the emitter electrode.

Therefore, when the capacitance between the gate electrode and the emitter electrode increases, the charge and discharge time increases. As a result, the switching characteristics deteriorate and switching loss increases. In addition, the total loss of the power device is the sum of steady loss which is determined by the on-voltage and the switching loss which occurs during a switching operation. Therefore, it is important to reduce the on-voltage and to reduce the capacitance between the gate electrode and the emitter electrode in order to reduce the switching loss. When the capacitance between the gate electrode and the emitter electrode is reduced, it is possible to prevent the deterioration of the switching characteristics.

As an IGBT which solves these problems, an IGBT including a floating p region has been proposed (for example, see JP 2001-308327 (FIG. 1)). In JP 2001-308327, the floating p region in a floating state is provided. Therefore, holes are less likely to be discharged to the emitter electrode in the vicinity of a portion below the floating p region when the IGBT is turned off and are stored in the floating p region. As a result, similarly to the above, the carrier concentration distribution of an n⁻ drift layer is close to the carrier concentration distribution of the diode and the on-voltage is reduced. The floating p region is also referred to as a floating mesa region. Since a trench gate structure is not formed in the floating p region, the capacitance between the gate electrode and the emitter electrode is reduced and the charge and discharge time is reduced. It is possible to reduce the switching loss.

M. Yamaguchi et al., "IEGT Design Criterion for Reducing EMI Noise," in Proc. ISPSD' 2004 pp. 115-118, 2004 (Abstract) discloses a necessity for improving turn-on characteristics which is common to the structure of JP 2001-308327 and the structure of JP 5-243561.

In addition, U.S. Pat. No. 6,815,769 discloses a structure for further improving the turn-on characteristics. That is, a polysilicon layer (gate electrode) which is filled in a trench is divided, only a polysilicon layer which is close to an n⁺ emitter region and a p base region (active mesa region) is separated and divided as a gate electrode, and a polysilicon layer which is close to a floating mesa region is not connected to a gate electrode, but is connected to an emitter electrode. In addition, U.S. Pat. No. 6,815,769 discloses the following method of dividing the polysilicon layer. A polysilicon layer is formed with a thickness that is not large enough to completely fill the trench. Then, the polysilicon layer on the bottom of the trench is cut using an oxide film as a mask, with the polysilicon layer remaining on the surface of the substrate. Then, for example, an oxide film fills a space between the polysilicon layers in the trench to separate the polysilicon layers on both side walls and a drawing portion to the polysilicon layer on the surface of the substrate is formed (for example, see U.S. Pat. No. 6,815,769 (FIG. 1)).

A horizontal MOS device with the following structure has been proposed: two gate polysilicon layers are provided in a trench so as to be separated from each other; one of the gate polysilicon layers is drawn to another trench which is connected to one side wall of the trench; and the other gate polysilicon layer is drawn to still another trench which is connected to the other side wall of the trench (for example, see the following JP 2010-258005 (FIGS. 2 and 3)).

However, in the method of dividing the polysilicon layer in the trench in order to improve the turn-on characteristics which is disclosed in U.S. Pat. No. 6,815,769, when the gate electrode is formed along both inner walls of the trench, a polysilicon film, which is a gate electrode material, is formed along the inner wall of the trench and the polysilicon film on the bottom of the trench is removed by general photolithography and etching, with the polysilicon film remaining on the front surface of the silicon substrate. In this way, the gate electrode in the trench is divided. Therefore, the number of process steps is too large and there is a concern that costs will increase or yield will be reduced.

SUMMARY OF THE INVENTION

The present invention has been made in view of the above-mentioned problems. It provides a semiconductor device which can improve turn-on characteristics, such as an on-voltage when the semiconductor device is turned on and switching loss, with a slight increase in the number of process steps, while preventing an increase in costs and a reduction in yield.

In order to solve the above-mentioned problems, according to an aspect of the invention, a semiconductor device includes: a first trench that is provided in a surface layer of a semiconductor layer of a first conductivity type; a second trench that is connected to one side wall of the first trench; a third trench that is connected to the other side wall of the first trench; a base region of a second conductivity type that is selectively formed in the surface layer of the semiconductor layer along the one side wall of the first trench at a depth that is less than the depth of the first trench; an emitter region that is formed in a surface layer of the base region so as to come into contact with the side wall of the first trench; and a floating potential region of the second conductivity type that is selectively formed in the surface layer of the semiconductor layer along the other side wall of the first trench. In addition, the semiconductor device includes: a first insulating film that is provided along the one side wall of the first trench and an inner wall of the second trench; a second insulating film that is provided along the other side wall of the first trench and an inner wall of the third trench; a first gate electrode that is provided on the first insulating film along the one side wall of the first trench and is provided in the second trench; a shield electrode that is provided on the second insulating film along the other side wall of the first trench and is provided in the third trench; and a third insulating film that fills a space between the first gate electrode and the shield electrode in the first trench. The semiconductor device further includes: a gate runner that is an extended portion of the second trench, has a portion which is provided on the first gate electrode, and is connected to the first gate electrode; an emitter polysilicon layer that is an extended portion of the third trench, has a portion which is provided on the shield electrode, and is connected to the shield electrode; an interlayer insulating film that covers the first gate electrode, the shield electrode, the emitter region, the gate runner, and the emitter polysilicon layer; a gate pad that is provided on the interlayer insulating film and is connected to the gate runner; and an emitter electrode that is provided on the interlayer insulating film so as to be separated from the gate pad and is connected to the emitter region, the base region, and the shield electrode.

In the semiconductor device according to the above-mentioned aspect of the invention, an opening width of the second trench and the third trench may be less than an opening width of the first trench.

In the semiconductor device according to the above-mentioned aspect of the invention, an opening width of the first trench may be less than two times the thickness of the first gate electrode.

In the semiconductor device according to the above-mentioned aspect of the invention, the second trench and the third trench may be arranged on the same straight line which traverses the first trench.

In the semiconductor device according to the above-mentioned aspect of the invention, a plurality of the second trenches may be provided with respect to one third trench, and a portion of the base region which is interposed between adjacent second trenches may face the third trench, with the first trench interposed therebetween.

In the semiconductor device according to the above-mentioned aspect of the invention, the second trench and a portion of the first trench may form a ring shape in a plan view, and the third trench and a portion of the first trench may form a ring shape in a plan view.

In the semiconductor device according to the above-mentioned aspect of the invention, a first connection portion between the side wall of the first trench and a side wall of the second trench and a second connection portion between the side wall of the first trench and a side wall of the third trench may be chamfered and have a round shape.

In the semiconductor device according to the above-mentioned aspect of the invention, the first connection portion and the second connection portion may not be covered with the emitter electrode and the gate pad, respectively.

The semiconductor device according to the above-mentioned aspect of the invention may further include: a collector layer of the second conductivity type that is provided on a rear surface of the semiconductor; and a collector electrode that is provided on a surface of the collector layer.

According to the semiconductor device of the invention, it is possible to improve turn-on characteristics, such as switching loss and an on-voltage when the semiconductor device is turned on, with a slight increase in the number of process steps, while preventing an increase in costs and a reduction in yield.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
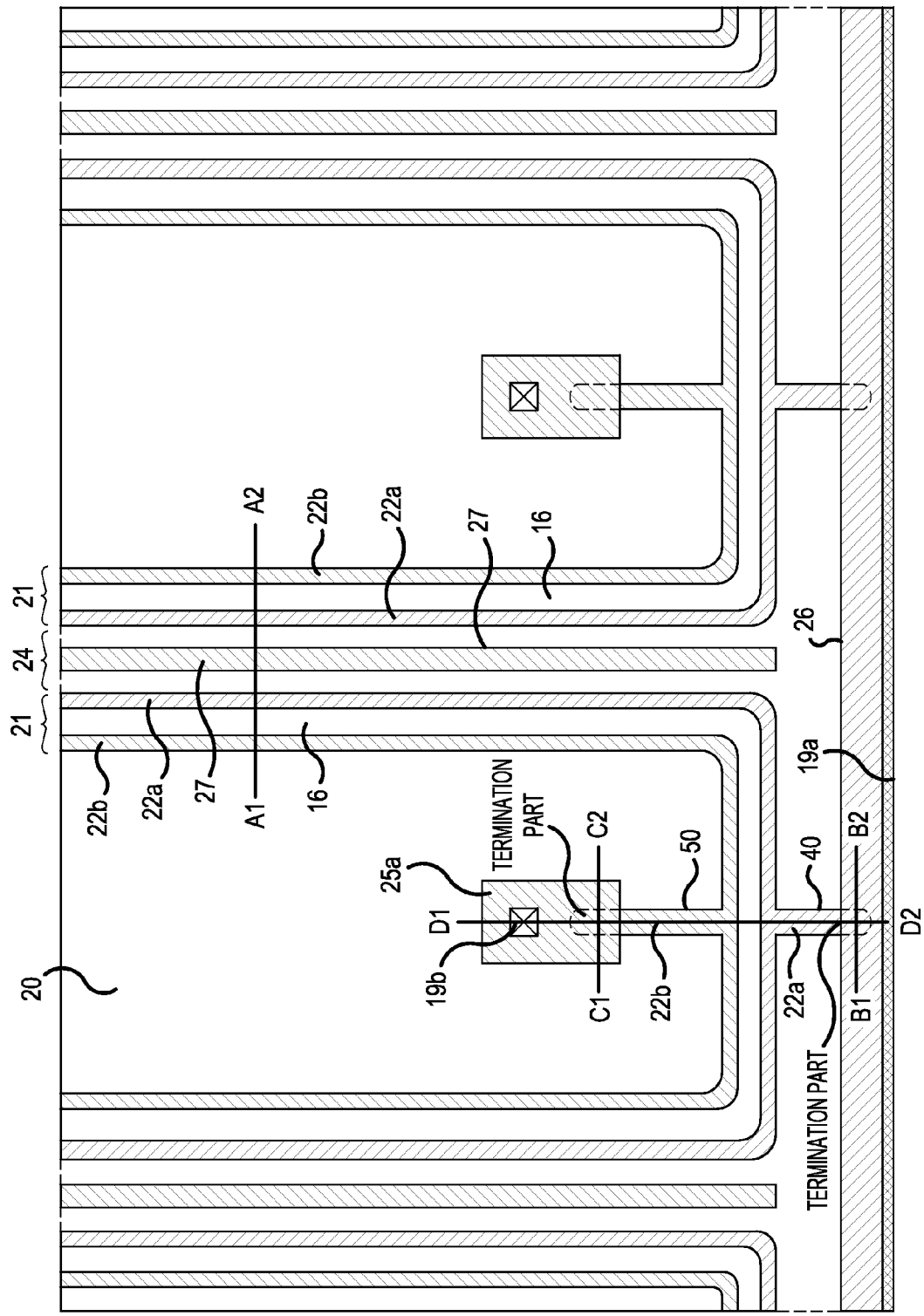
FIG. 1 is a plan view illustrating the planar layout of a main portion of a semiconductor device according to Embodiment 1.

Hereinafter, embodiments of a semiconductor device according to the invention will be described in detail with reference to the drawings. In the specification and the accompanying drawings, in the layers or regions having "n" or "p" appended thereto, an electron or a hole means a majority carrier. In addition, symbols "+" and "−" added to n or p mean that impurity concentration is higher and lower, respectively, than that of the layer without the symbols. In the description of the following embodiments and the accompanying drawings, the same components are denoted by the same reference numerals and the description thereof will not be repeated. In addition, in the accompanying drawings described in the following embodiments, scales and dimensions are different from the actual scales and dimensions for ease of illustration or ease of understanding. The invention is not limited to the following embodiments as long as it does not depart from the scope and spirit thereof.

Embodiment 1

Figure 9:
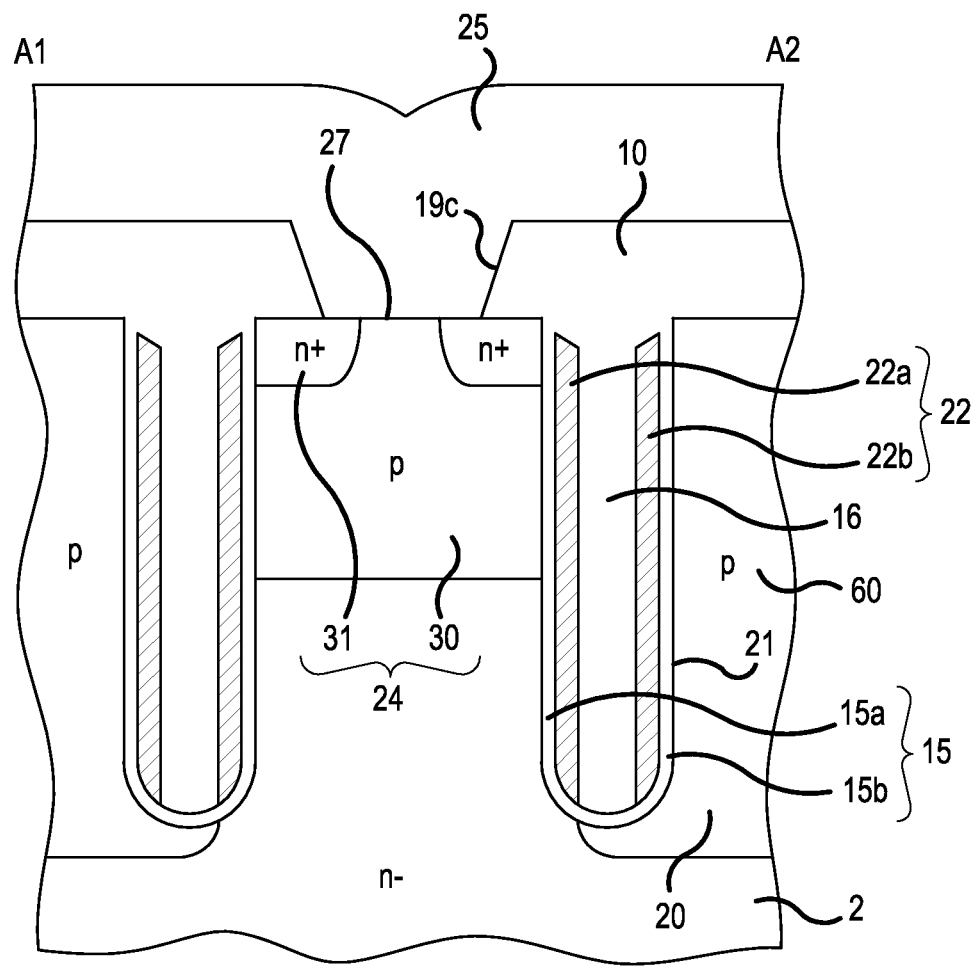
FIG. 9 is a cross-sectional view illustrating a cross-sectional structure taken along the cutting line A1-A2 of FIG. 1.
Figure 10:
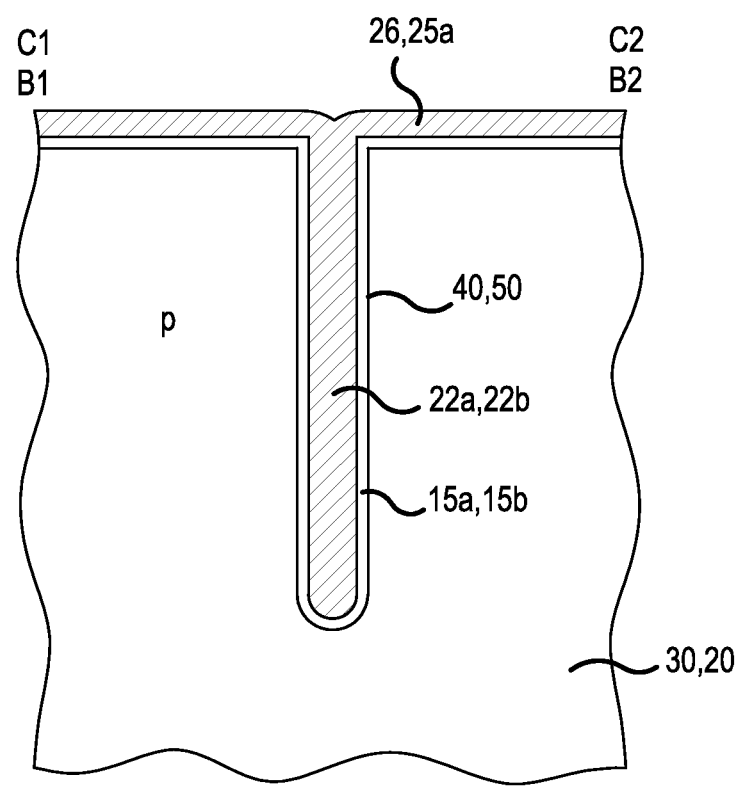
FIG. 10 is a cross-sectional view illustrating a cross-sectional structure taken along the cutting lines B1-B2 and C1-C2 of FIG. 1.
Figure 11:
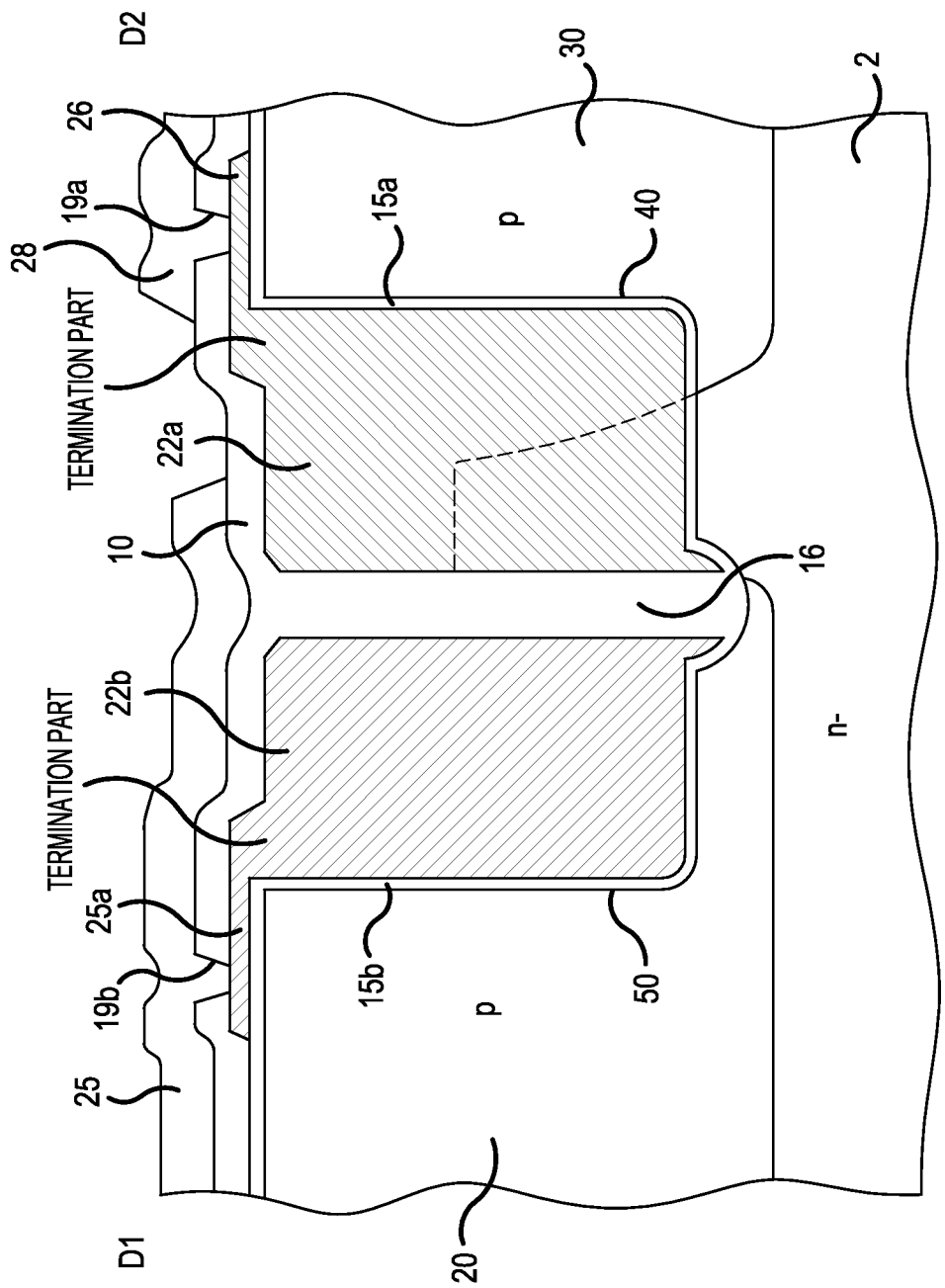
FIG. 11 is a cross-sectional view illustrating a cross-sectional structure taken along the cutting line D1-D2 of FIG. 1.

The structure of a semiconductor device according to Embodiment 1 will be described. FIG. 1 is a plan view illustrating the planar layout of a main portion of the semiconductor device according to Embodiment 1. FIG. 9 is a cross-sectional view illustrating a cross-sectional structure taken along the cutting line A1-A2 of FIG. 1. FIG. 10 is a cross-sectional view illustrating a cross-sectional structure taken along the cutting lines B1-B2 and C1-C2 of FIG. 1. FIG. 11 is a cross-sectional view illustrating a cross-sectional structure taken along the cutting line D1-D2 of FIG. 1. First, the planar layout of the semiconductor device according to Embodiment 1 will be described. The semiconductor device according to Embodiment 1 includes an active region in which a current flows in an on state and a breakdown voltage region which reduces the electric field of a portion of an $n^-$ drift layer which is close to a front surface of a silicon substrate and holds a breakdown voltage. The breakdown voltage region surrounds the active region.

In the active region, a floating p region 20 (floating region) extends in a straight line shape. A shield electrode 22b includes an electrode portion with a substantially rectangular ring shape in a plan view and surrounds the floating p region 20. In addition, the shield electrode 22b includes an electrode portion which has a straight line shape in a plan view, is connected to the electrode portion with the substantially rectangular ring shape in a plan view, and is provided in a region surrounded by the electrode portion with the substantially rectangular ring shape. A termination part of the linear electrode portion in the shield electrode 22b comes into contact with an emitter polysilicon layer 25a.

A first gate electrode 22a includes an electrode portion which has a substantially rectangular ring shape in a plan view and surrounds the shield electrode 22b. The first gate electrode 22a includes an electrode portion which has a straight line shape in a plan view, is connected to the electrode portion with the substantially rectangular ring shape in a plan view, and is provided outside the electrode portion with the substantially rectangular ring shape. A termination part of the linear electrode portion in the first gate electrode 22a comes into contact with a gate runner (second gate electrode) 26.

A third insulating film 16 is provided in a region between the first gate electrode 22a and the shield electrode 22b. The first gate electrode 22a, the shield electrode 22b, and the third insulating film 16 are arranged in a first trench 21 which has a substantially rectangular ring shape in a plan view. As such, a plurality of first trenches 21, each having the first gate electrode 22a, the shield electrode 22b, and the third insulating film 16 arranged therein, are arranged in parallel to each other in the lateral direction of the first trench 21. An active mesa region 24 is provided between adjacent first gate electrodes 22a. A p base region 30 (see FIG. 9) is provided in the active mesa region 24. An $n^+$ emitter region 31 (see FIG. 9) is provided in a surface layer of the p base region 30. An emitter electrode 25 (see FIG. 9) comes into contact with the p base region 30 and the $n^+$ emitter region 31. In the p base region 30 and the $n^+$ emitter region 31, a region which comes into contact with the emitter electrode 25 is referred to as an emitter contact region 27.

A second trench 40 which has a straight line shape in a plan view and has one end connected to an outer side wall of the first trench 21 is provided outside the first trench 21 with the substantially rectangular ring shape. Specifically, the second trench 40 is provided in a part of the p base region 30 in which the $n^+$ emitter region 31 is not provided. The first gate electrode 22a is arranged in the second trench 40.

A third trench 50 which has a straight line shape in a plan view and has one end connected to an inner side wall of the first trench 21 is provided in a region surrounded by the first trench 21 with the substantially rectangular ring shape. Specifically, the third trench 50 is provided in the floating p region 20 surrounded by the first trench 21 with the substantially rectangular ring shape. The shield electrode 22b is arranged in the third trench 50. The second trench 40 and the third trench 50 are arranged on the same straight line which traverses the first trench 21.

The emitter electrode 25 (see FIG. 9) is arranged on the surfaces of the p base region 30, the floating p region 20, the first gate electrode 22a, the shield electrode 22b, and the emitter polysilicon layer 25a, with an interlayer insulating film 10 (see FIG. 9) interposed therebetween. The emitter electrode 25 is connected to the $n^+$ emitter region 31, the p base region 30, and the shield electrode 22b.

The emitter polysilicon layer 25a is provided on the insulating film 15 (see FIG. 9), which is provided on the floating p region 20 in a region surrounded by the electrode portion with the substantially rectangular ring shape in the shield electrode 22b, and on the linear electrode portion of the shield electrode 22b. Specifically, the emitter polysilicon layer 25a is arranged such that a portion thereof covers the termination part of the linear electrode portion of the shield electrode 22b. That is, since the third trench 50 connected to the first trench 21 extends immediately below the emitter polysilicon layer 25a, the shield electrode 22b is connected to the emitter polysilicon layer 25a.

The gate runner 26 has a substantially rectangular ring shape in a plan view and is arranged in the outer circumference of the active region so as to surround the emitter electrode 25. A region (including the gate runner 26) inside the gate runner 26 is the active region. In addition, the gate runner 26 is provided on the insulating film 15, which is provided on the p base region 30, and on the linear electrode portion of the first gate electrode 22a. Specifically, the gate runner 26 is arranged such that a portion thereof covers the termination part of the linear electrode portion of the first gate electrode 22a. That is, since the second trench 40 connected to the first trench 21 extends immediately below the gate runner 26, the first gate electrode 22a is connected to the gate runner 26. The gate runner 26 is connected to a gate pad 28 (see FIG. 11).

First to third contact holes 19a to 19c which have a substantially rectangular shape in a plan view are provided in the interlayer insulating film 10. The first contact hole 19a (gate runner contact hole) extends on the gate runner 26 along the outer circumference of the active region. The second contact hole 19b (emitter contact hole) is provided on the emitter polysilicon layer 25a. The third contact hole 19c (see FIG. 9) extends on the p base region 30 along the direction in which the p base region 30 extends. The first to third contact holes 19a to 19c may be configured such that a plurality of contact holes with a substantially squire shape in a plan view are arranged at predetermined intervals.

Next, the cross-sectional structure of the semiconductor device according to Embodiment 1 will be described. As shown in FIG. 9, a p layer 60 including the p base region 30 and the floating p region 20 is provided in a surface layer of a surface of an $n^-$ drift layer 2, which is close to the front surface of the silicon substrate, in the silicon substrate in which the $n^-$ drift layer 2 is formed on a front surface of a $p^+$ semiconductor substrate that will be a $p^+$ collector region (not shown).

A plurality of first trenches 21 are provided in the p layer 60 so as to extend from the front surface of the silicon substrate to the $n^-$ drift layer 2 through the p layer 60. The first trenches 21 divide the p layer 60 into the mesa-shaped p base region 30 and the floating p region 20. The p base region 30 is interposed between the outer side walls of the first trenches 21 and the floating p region 20 is surrounded by the internal side wall of the first trench 21.

That is, the p base region 30 and the floating p region 20 are alternately arranged. The $n^+$ emitter region 31 is selectively provided in the p base region 30. In addition, the n+ emitter region 31 comes into contact with the insulating film (a first insulating film 15a which will be described below) provided on the outer side wall of the first trench 21. The p base region 30 and the n+ emitter region 31 comes into contact with the emitter electrode 25 through the third contact hole 19c formed in the interlayer insulating film 10 in the emitter contact region 27. The n+ emitter region 31 is not provided in the floating p region 20.

As shown in FIG. 11 which will be described below, the p base region 30 includes a portion which is deeper than the first trench 21 in the region in which the second trench 40 is formed. The depth of the second trench 40 is less than the depth of the portion of the p base region 30 that is greater than the depth of the first trench 21. As such, when most of the bottom of the second trench 40 is surrounded by the p base region 30, it is possible to reduce the concentration of the electric field on the bottom of the second trench 40.

The floating p region 20 is insulated from the n− drift layer 2 by a pn junction with the n− drift layer 2. In addition, the floating p region 20 is insulated from the shield electrode 22b in the first trench 21 by an insulating film (second insulating film 15b which will be described below) that is provided along the inner side wall of the first trench 21. That is, the floating p region 20 is in a so-called floating state. In the on state, holes are stored in the floating p region 20. As shown in FIG. 9, it is preferable that the depth of the floating p region 20 be greater than the depth of the first trench 21. For example, it is preferable to provide the floating p region 20 so as to cover the corners of the bottom of the first trench 21. In this case, it is possible to reduce the electric field in the vicinity of the bottom of the first trench 21. In addition, the depth of the floating p region 20 may be less than the first trench 21. In this case, the depth of the floating p region 20 may be equal to the depth of the p base region 30.

The insulating film 15 is provided in each of the first trenches 21 along the inner wall of the first trench 21. In order to clarify the arrangement of the first gate electrode 22a and the shield electrode 22b in the first trench 21, the insulating film which is provided from the side wall of the first trench 21 close to the p base region 30 to the bottom is referred to as the first insulating film 15a and the insulating film which is provided from the side wall of the first trench 21 close to the floating p region 20 to the bottom is referred to as the second insulating film 15b. In the first trench 21, the first gate electrode 22a and the shield electrode 22b are provided on the first insulating film 15a and the second insulating film 15b, respectively.

The opening width of the first gate electrode 22a and the opening width of the shield electrode 22b may be, for example, 0.5 μm with respect to the opening width, about 2 μm, of the first trench 21. The first gate electrode 22a and the shield electrode 22b may be, for example, a conductive layer made of polysilicon (poly-Si) or a metal material with a high melting point. The third insulating film 16 is provided between the first gate electrode 22a and the shield electrode 22b. The first gate electrode 22a and the shield electrode 22b are insulated from each other by the third insulating film 16. The third insulating film 16 may be an oxide film with high embeddability, such as a high temperature oxide (HTO) film or a tetraethoxysilane (TEOS) film.

The interlayer insulating film 10 is provided on the front surface of the silicon substrate so as to cover the p base region 30, the floating p region 20, the first gate electrode 22a, the shield electrode 22b, the emitter polysilicon layer 25a, and the gate runner 26. The emitter electrode 25 and the gate pad 28 (gate electrode metal film) are selectively provided on the interlayer insulating film 10 so as to cover the interlayer insulating film 10. The emitter electrode 25 is separated from the gate pad 28. The first to third contact holes 19a to 19c (see FIG. 9 and FIG. 11) are provided in the interlayer insulating film 10 such that the above-mentioned planar layout is obtained.

Specifically, as shown in FIG. 11 which will be described below, the first contact hole 19a is selectively provided in a portion of the interlayer insulating film 10 which is covered with the gate pad 28 and selectively exposes the gate runner 26. As shown in FIG. 11 which will be described below, the second contact hole 19b is selectively provided in a portion of the interlayer insulating film 10 which is covered with the emitter electrode 25 and selectively exposes the emitter polysilicon layer 25a. The third contact hole 19c is selectively provided in a portion of the interlayer insulating film 10 which is covered with the emitter electrode 25 and selectively exposes the n+ emitter region 31 and the p+ base region 30.

A barrier metal film (not shown) which includes, for example, a titanium (Ti) film and a titanium nitride (TiN) film is formed in the first to third contact holes 19a to 19c on the silicon substrate side and a tungsten (W) film is formed on the barrier metal film. In this way, as shown in FIG. 11 which will be described below, the gate runner 26 is connected to the gate pad 28 through the first contact hole 19a. The emitter polysilicon layer 25a is connected to the emitter electrode 25 through the second contact hole 19b. That is, the gate runner 26 and the emitter polysilicon layer 25a are directly connected to contact plugs (including the barrier metal film and the tungsten film) which are formed on the surfaces of the gate runner 26 and the emitter polysilicon layer 25a.

The shield electrode 22b is connected to the emitter electrode 25 to reduce the capacitance between the gate and the emitter. The emitter electrode 25 is connected to the n+ emitter region 31 and the emitter contact region 27 through the third contact hole 19c. In addition, the emitter electrode 25 is insulated from the first gate electrode 22a and the shield electrode 22b by the interlayer insulating film 10. The emitter electrode 25 and the gate pad 28 are covered with a passivation film (not shown) which is a silicon nitride film or a polyimide film. A collector electrode (not shown) comes into contact with the p+ collector region.

FIG. 10 is a diagram illustrating the cross-sectional structure taken along the cutting lines B1-B2 and C1-C2 of FIG. 1. In FIG. 10, as represented by reference numerals 40, 50, 15a, and 15b, the insulating film 15a is provided on the side wall of the second trench 40 and the insulating film 15b is provided on the side wall of the third trench 50. In FIG. 10, as represented by reference numerals 22a, 22b, 26, and 25a, the first gate electrode 22a provided in the second trench 40 is connected to the gate runner 26 in the vicinity of the termination part of the linear electrode portion and the shield electrode 22b provided in the third trench 50 is connected to the emitter polysilicon layer 25a in the vicinity of the termination part of the linear electrode portion.

As described above, since a portion of the first gate electrode 22a is provided immediately below the gate runner 26, the first gate electrode 22a is connected to the gate runner 26 in the vicinity of the termination part of the linear electrode portion. Since a portion of the shield electrode 22b is provided immediately below the emitter polysilicon layer 25a, the shield electrode 22b is connected to the emitter polysilicon layer 25a in the vicinity of the termination part of the linear electrode portion. That is, the first gate electrode 22a is connected to the gate pad 28 through the gate runner 26 and the first contact hole 19a. The shield electrode 22b is connected to the emitter electrode 25 through the emitter polysilicon layer 25a and the second contact hole 19b.

As shown in the drawings, the other ends of the second and third trenches 40 and 50 extend immediately below the gate runner 26 and the emitter polysilicon layer 25a, respectively. Therefore, it is very easy to connect the first gate electrode 22a and the gate runner 26 and to connect the shield electrode 22b and the emitter polysilicon layer 25a.

Next, a method of manufacturing the semiconductor device according to Embodiment 1 will be described. FIGS. 2 to 7 are cross-sectional views illustrating the state of the semiconductor device according to Embodiment 1 during manufacture. First, a silicon substrate in which the n⁻ drift layer 2 is formed on the front surface of the p⁺ semiconductor substrate which will be the p⁺ collector region is prepared. Then, a mask (not shown) is formed on the surface of the silicon substrate by photolithography and ion implantation for forming a depth region of the p base region 30 and the floating p region 20 is performed.

Figure 13:
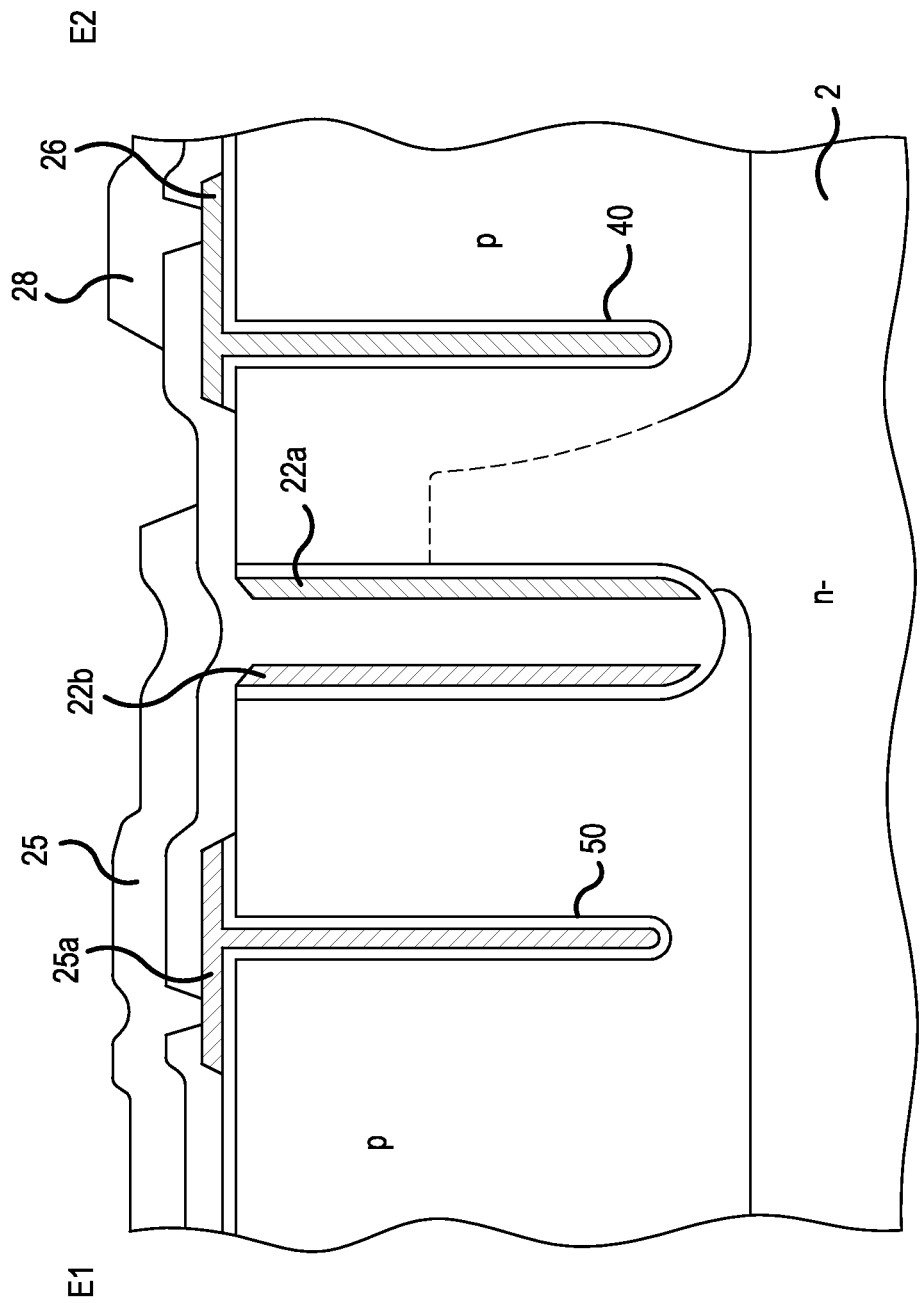
FIG. 13 is a cross-sectional view illustrating a cross-sectional structure taken along the cutting line E1-E2 of FIG. 12.

A plurality of first trenches 21, the second trench 40 (see FIG. 1 and FIG. 11), and the third trench 50 (see FIG. 1 and FIG. 11) are formed at a depth that does not reach the p⁺ collector region from the front surface of the silicon substrate by photolithography and etching. In this case, the opening width of the first trench 21 is for example, 2 μm and the opening width of the second and third trenches 40 and 50 is, for example, 1 μm. That is, the opening width of the second and third trenches 40 and 50 is less than the opening width of the first trench 21. Since the opening width of the second and third trenches 40 and 50 is less than the opening width of the first trench 21 as described above, the depth of the second and third trenches 40 and 50 is less than the depth of the first trench 21 even when the second and third trenches 40 and 50 are formed under the same conditions as those for forming the first trench 21, as shown in FIG. 13 which will be described below.

A heat treatment is performed to form the depth region of the p base region 30 and the floating p region 20. It is preferable that the heat treatment be performed before an ion implantation process for forming a shallow region of the p base region 30 which will be described below.

Figure 2:
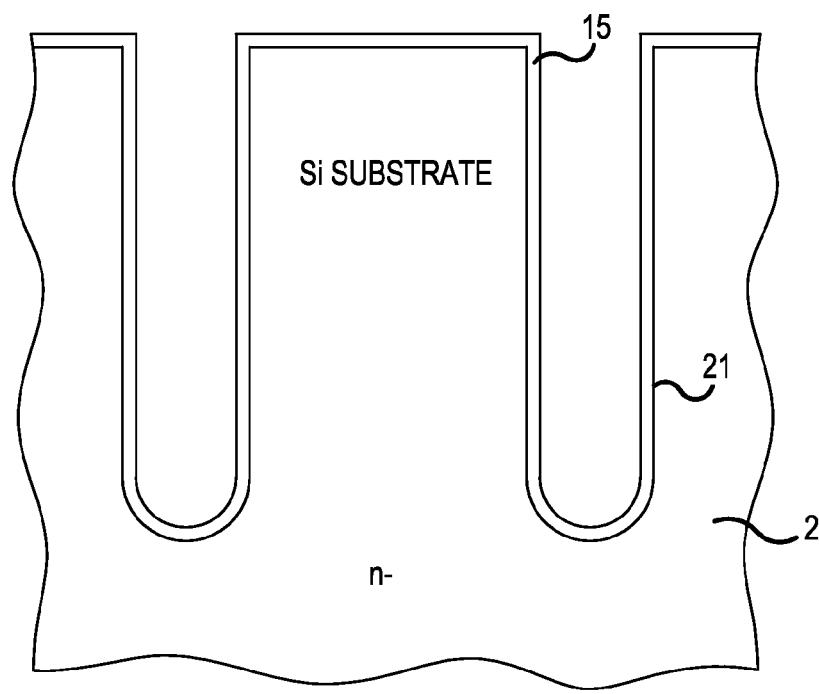
FIG. 2 is a cross-sectional view illustrating the state of the semiconductor device according to Embodiment 1 during manufacture (part 1)
Figure 3:
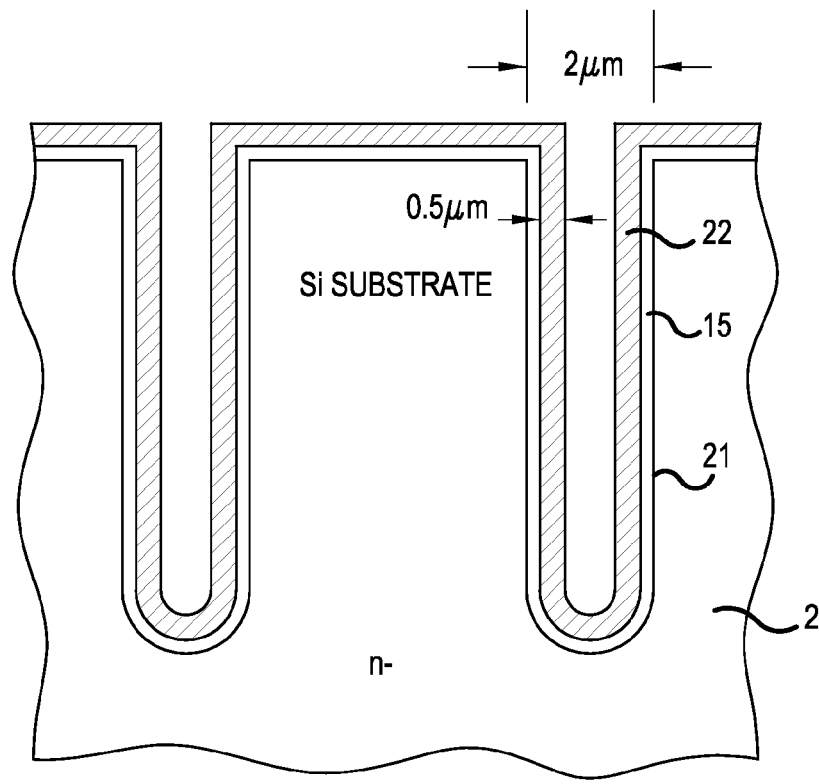
FIG. 3 is a cross-sectional view illustrating the state of the semiconductor device according to Embodiment 1 during manufacture (part 2)

As shown in FIG. 2, the insulating film 15 is formed in the first trench 21, the second trench 40, and the third trench 50 along the inner walls of the first trench 21, the second trench 40, and the third trench 50. In this case, as shown in FIG. 3, the polysilicon layer 22 is grown such that the insulating film 15 is not covered with the polysilicon layer 22 in the first trench 21 and the entire insulating film 15 is covered with the polysilicon layer 22 in the second and third trenches 40 and 50. For example, when the opening width of the first trench 21 is 2 μm, it is preferable to grow the polysilicon layer 22 with a thickness of about 0.5 μm. As described above, the opening width of the second and third trenches 40 and 50 is less than the opening width of the first trench 21. Therefore, even when the entire insulating film 15 is covered with the polysilicon layer 22 in the second and third trenches 40 and 50, the insulating film 15 is not covered with the polysilicon layer 22 in the first trench 21.

Figure 4:
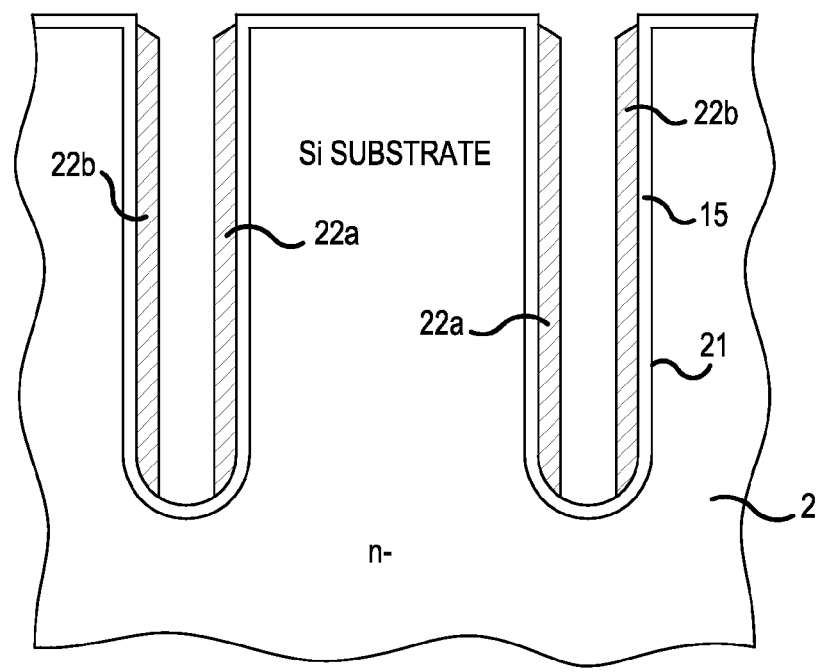
FIG. 4 is a cross-sectional view illustrating the state of the semiconductor device according to Embodiment 1 during manufacture (part 3)

As shown in FIG. 4, the polysilicon layer 22 is etched back by anisotropic etching such that the polysilicon layer 22 on the front surface of the silicon substrate (the surface of the n⁻ drift layer 2) and on the bottom of the first trench 21 is removed and the polysilicon layer 22 on the side wall of the first trench 21 remains. That is, only the polysilicon layer 22 which is stuck on the side wall of the first trench 21 with the insulating film 15 interposed therebetween remains. In this case, the polysilicon layer 22 which covers the insulating film 15 in the second and third trenches 40 and 50 remains substantially in the state before the etching-back. The polysilicon layer 22 which remains on the side wall of the first trench 21 is the first gate electrode 22a and the shield electrode 22b. In addition, the polysilicon layer 22 which remains in the second trench 40 is the first gate electrode 22a. The polysilicon layer 22 which remains in the third trench 50 is the shield electrode 22b.

Figure 5:
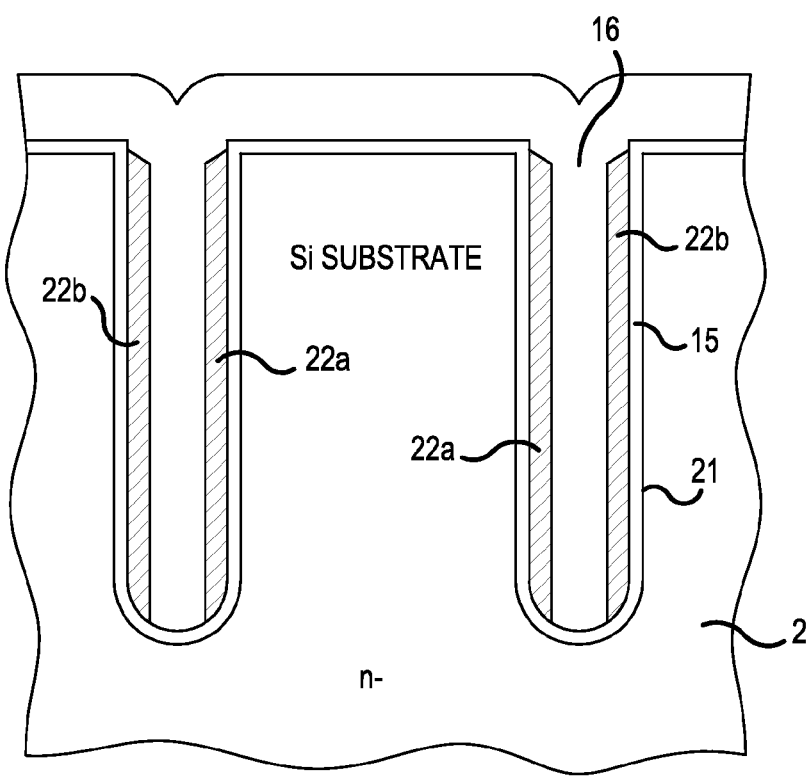
FIG. 5 is a cross-sectional view illustrating the state of the semiconductor device according to Embodiment 1 during manufacture (part 4)
Figure 6:
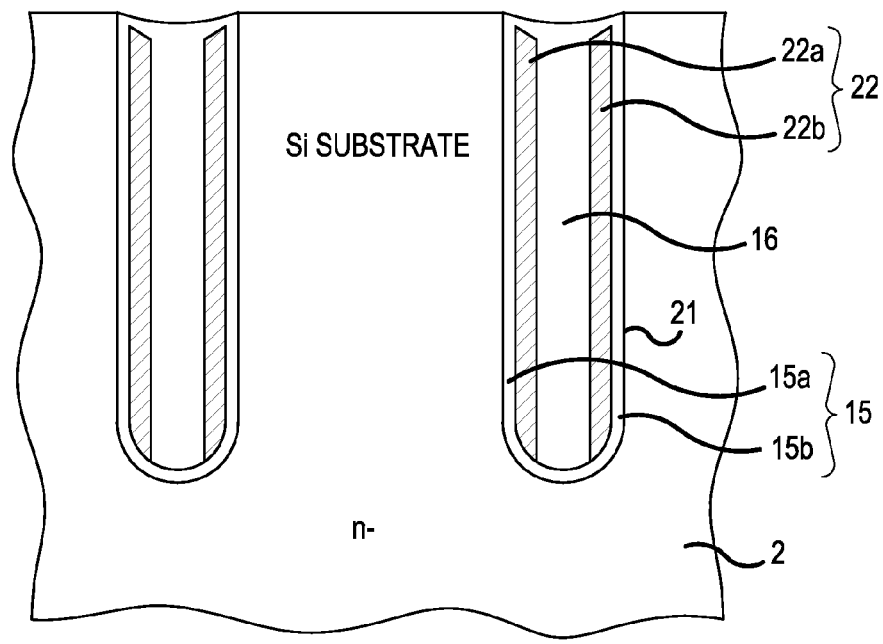
FIG. 6 is a cross-sectional view illustrating the state of the semiconductor device according to Embodiment 1 during manufacture (part 5)

As shown in FIG. 5, the third insulating film 16 with high embeddability, such as an HTO film or a TEOS film, is formed so as to cover the polysilicon layer 22 in the first trench 21. As shown in FIG. 6, the third insulating film 16 is etched back and the third insulating film 16 on the front surface of the silicon substrate is removed. Then, the third insulating film 16 remains on the polysilicon layer 22 in the first trench 21 and the insulating film 15 remains on the inner walls of the first trench 21, the second trench 40, and the third trench 50. The insulating film 15 which remains on the inner wall of the first trench 21 is the first and second insulating films 15a and 15b. In addition, the insulating film 15 which remains on the inner wall of the second trench 40 is the first insulating film 15a. The insulating film 15 which remains on the inner wall of the third trench 50 is the second insulating film 15b. That is, the polysilicon layer 22 which is formed on both side walls of the first trench 21 with the insulating film 15 interposed therebetween is divided into the polysilicon layer 22 (first gate electrode 22a) close to the active mesa region 24 and the polysilicon layer 22 (shield electrode 22b) close to the floating p region 20.

Figure 7:
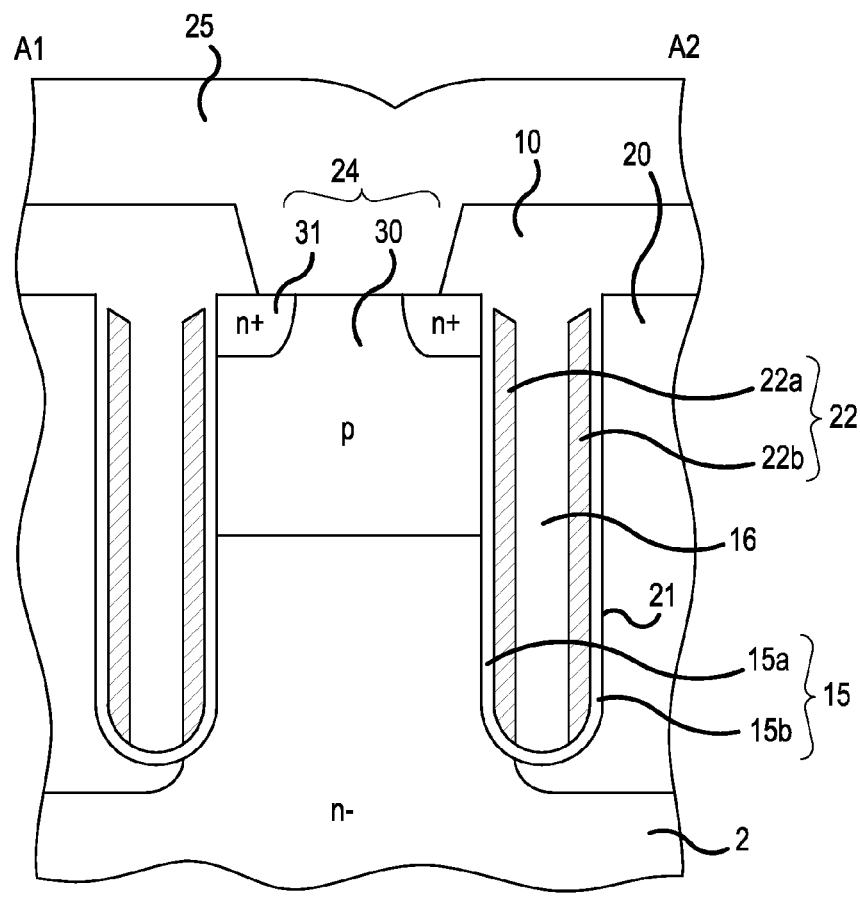
FIG. 7 is a cross-sectional view illustrating the state of the semiconductor device according to Embodiment 1 during manufacture (part 6)
Figure 8:
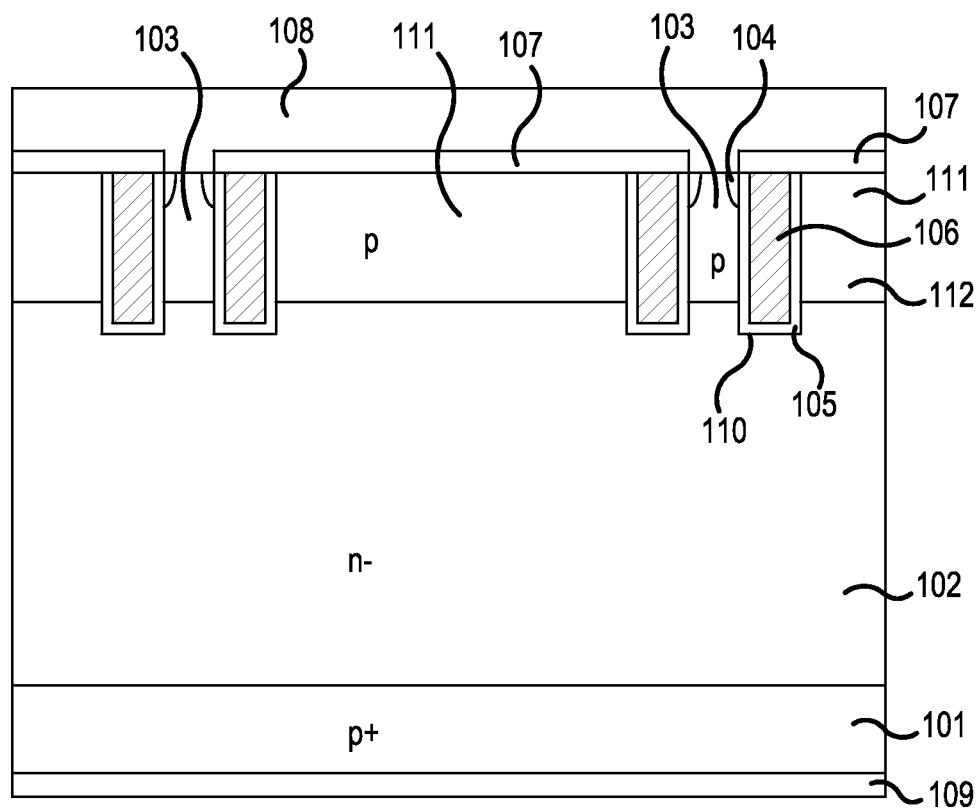
FIG. 8 is a cross-sectional view illustrating a trench gate IGBT including a floating potential region according to the related art.

As shown in FIG. 7, a first resist mask (not shown) that has an opening corresponding to a region for forming the p base region 30 in a portion in which a MOS gate structure is formed (that is, a portion which is disposed outside the first trench 21 and is interposed between adjacent first trenches 21) is formed on the front surface of the silicon substrate. P-type impurity ions, such as boron ions, are implanted using the first resist mask as a mask to form the p base region 30 at a depth that is less than the depth of the first trench 21 in a surface layer of the n⁻ drift layer 2 in the portion which is disposed outside the first trench 21 and is interposed between adjacent first trenches 21. In this way, the p base region 30 which is divided by a plurality of first trenches 21 is formed. Then, the first resist mask is removed.

A second resist mask that has an opening corresponding to a region for forming the n⁺ emitter region 31 is formed on the front surface of the silicon substrate. N-type impurity ions, such as phosphorus ions, are implanted using the second resist mask as a mask. As shown in FIG. 7, the n⁺ emitter region 31 is formed in a surface layer of the p base region 30. Then, the second resist mask is removed. The p base region 30 and the n⁺ emitter region 31 which are formed in a mesa silicon substrate portion interposed between adjacent first trenches 21 come into contact with the emitter electrode 25 to form the active mesa region 24. A mesa silicon substrate portion in which the n⁺ emitter region 31 is not formed is covered with the insulating film 15 and becomes the floating p region 20 which is a floating mesa region.

The gate runner 26 is formed on the p base region 30 and on the termination part of the linear electrode portion of the first gate electrode 22a, with the insulating film 15 interposed therebetween (see FIG. 11). The emitter polysilicon layer 25a is formed on the floating p region 20 and on the termination part of the linear electrode portion of the shield electrode 22b, with the insulating film 15 interposed therebetween (see FIG. 11). When the emitter polysilicon layer 25a and the gate runner 26 are patterned by etching, the upper side of the second and third trenches 40 and 50 is protected by a resist mask so as not to be etched back, which makes it possible easily to provide the emitter polysilicon layer 25a and the gate runner 26.

The interlayer insulating film 10 is formed on the entire front surface of the silicon substrate (see FIG. 7 and FIG. 11). Portions of the interlayer insulating film 10 which correspond to regions for forming the first to third contact holes 19a to 19c are removed by photolithography and etching. The gate runner 26 which is connected to the first gate electrode 22a formed in the second trench 40 is selectively exposed through the first contact hole 19a. The emitter polysilicon layer 25a which is connected to the shield electrode 22b formed in the third trench 50 is selectively exposed through the second contact hole 19b. In addition, the $n^+$ emitter region 31 and the $p^+$ base region 30 are selectively exposed through the third contact hole 19c. Then, a barrier metal film, which includes, for example, a titanium film and a titanium nitride film, is formed in the first to third contact holes 19a to 19c.

A tungsten film is formed so as to fill the first to third contact holes 19a to 19c. The tungsten film is etched back and the tungsten film on the surface of the interlayer insulating film 10 is removed. The emitter electrode 25 is formed on the interlayer insulating film 10 and the gate pad 28 is formed on the interlayer insulating film 10 so as to be separated from the emitter electrode 25. The polysilicon layer 22 which is the first gate electrode 22a is connected to the gate pad 28 through the gate runner 26, the barrier metal film, and the tungsten film. The polysilicon layer 22 which is the shield electrode 22b is connected to the emitter electrode 25 through the emitter polysilicon layer 25a, the barrier metal film, and the tungsten film. A passivation film is formed on the surface of the silicon substrate and is selectively opened such the gate pad 28 and the emitter electrode 25 are partially exposed. The exposed emitter electrode 25 is an emitter pad. A collector electrode (not shown) is formed on the rear surface of the silicon substrate. In this way, the semiconductor device shown in FIG. 1 and FIGS. 9 to 11 is completed.

As described above, according to Embodiment 1, it is possible to provide a semiconductor device which can significantly reduce gate mirror capacitance, improve turn-on characteristics, and reduce an on-voltage and switching loss, with a slight increase in the number of process steps.

Embodiment 2

Figure 12:
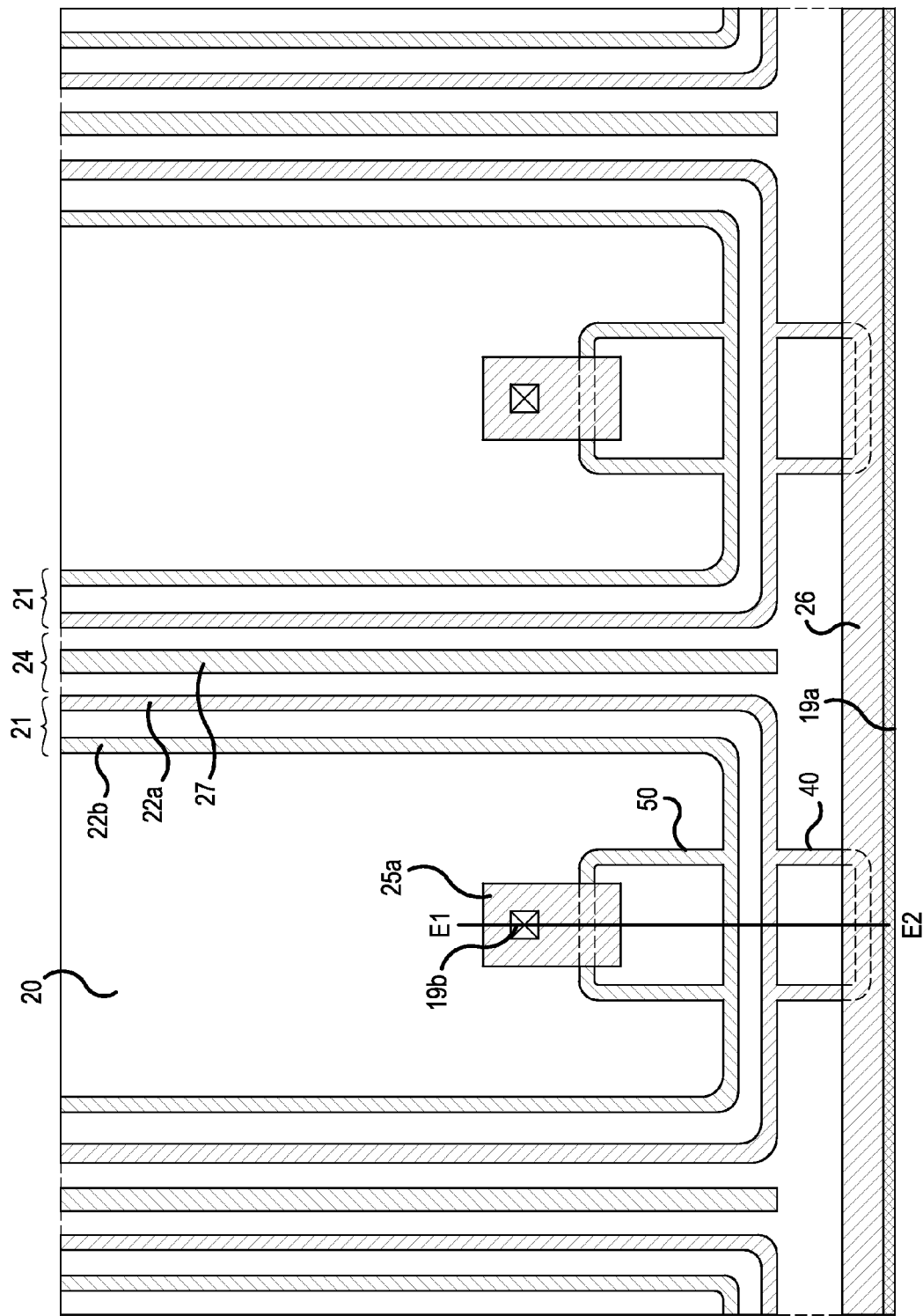
FIG. 12 is a plan view illustrating the planar layout of a main portion of a semiconductor device according to Embodiment 2.

Next, the structure of a semiconductor device according to Embodiment 2 will be described. FIG. 12 is a plan view illustrating the planar layout of a main portion of the semiconductor device according to Embodiment 2. The semiconductor device according to Embodiment 2 differs from the semiconductor device according to Embodiment 1 in the planar shape of the second and third trenches 40 and 50. Specifically, as shown in FIG. 12, the second trench 40 has a substantial U-shape in a plan view and both ends thereof are connected to the outer side wall of the first trench 21. That is, the second trench 40 and a portion of the first trench 21 form a substantially rectangular ring shape in a plan view. The planar shape of the second trench 40 is not limited to the substantial U-shape. The second trench 40 may be formed such that both ends thereof are connected to the outer side wall of the first trench 21 to form a substantially rectangular ring shape in a plan view together with the first trench 21. The second trench 40 and a portion of the first trench 21 may form a ring shape in a plan view.

The third trench 50 has a substantial U-shape in a plan view and both ends thereof are connected to the inner side wall of the first trench 21. That is, the third trench 50 and a portion of the first trench 21 form a substantially rectangular ring shape in a plan view. The planar shape of the third trench 50 is not limited to the substantial U-shape. The third trench 50 may be formed such that both ends thereof are connected to the inner side wall of the first trench 21 to form a substantially rectangular ring shape in a plan view together with the first trench 21. The third trench 50 and a portion of the first trench 21 may form a ring shape in a plan view. For example, the third trench 50 may be provided symmetrically to the second trench 40, with the first trench 21 interposed therebetween.

The semiconductor device according to Embodiment 2 is formed such that the second trench 40 and a portion of the first trench 21 form a substantially rectangular ring shape in a plan view and the third trench 50 and a portion of the first trench 21 form a substantially rectangular ring shape in a plan view. It is preferable that a first gate electrode 22a and a shield electrode 22b be connected to a gate runner 26 and an emitter polysilicon layer 25a in the vicinity of the substantially central portions of the second trench 40 and the third trench 50, respectively. In other words, preferably, the first gate electrode 22a and the shield electrode 22b are not connected to the gate runner 26 and the emitter polysilicon layer 25a in the vicinity of the termination parts of the second trench 40 and the third trench 50, respectively.

When the second trench 40 and the third trench 50 are formed in this way, the first gate electrode 22a and the shield electrode 22b are connected to the gate runner 26 and the emitter polysilicon layer 25a in the vicinity of the substantially central portions of the second trench 40 and the third trench 50, respectively, and are not connected to the gate runner 26 and the emitter polysilicon layer 25a in the vicinity of the termination parts of the second trench 40 and the third trench 50, respectively. Therefore, the effect of preventing a reduction in gate breakdown voltage and a reduction in the reliability of gate characteristics due to the shape of the termination part of each trench is obtained.

Next, the cross-sectional structure of the semiconductor device according to Embodiment 2 will be described. FIG. 13 is a cross-sectional view illustrating the cross-sectional structure taken along the cutting line E1-E2 of FIG. 12. As shown in FIG. 13, the second trench 40 and the third trench 50 extend immediately below the emitter polysilicon layer 25a and the gate runner 26, respectively. Therefore, it is very easy to connect the first gate electrode 22a and the gate runner 26 and to connect the shield electrode 22b and the emitter polysilicon layer 25a.

As described above, according to Embodiment 2, since the semiconductor device has the same cross-sectional structure as the semiconductor device according to Embodiment 1, it is possible to obtain the same effect as that in Embodiment 1. In addition, according to Embodiment 2, the second trench 40 and a portion of the first trench 21 form a substantially rectangular ring shape in a plan view and the third trench 50 and the first trench 21 form a substantially rectangular ring shape in a plan view. The first gate electrode 22a and the shield electrode 22b are connected to the gate runner 26 and the emitter polysilicon layer 25a in the vicinity of the substantially central portions of the second trench 40 and the third trench 50, respectively, and are not connected to the gate runner 26 and the emitter polysilicon layer 25a in the vicinity of the termination parts of the second trench 40 and the third trench 50, respectively. Therefore, it is possible to prevent a reduction in gate breakdown voltage and a reduction in the reliability of gate characteristics due to the shape of the termination part of each trench.

Embodiment 3

Figure 14:
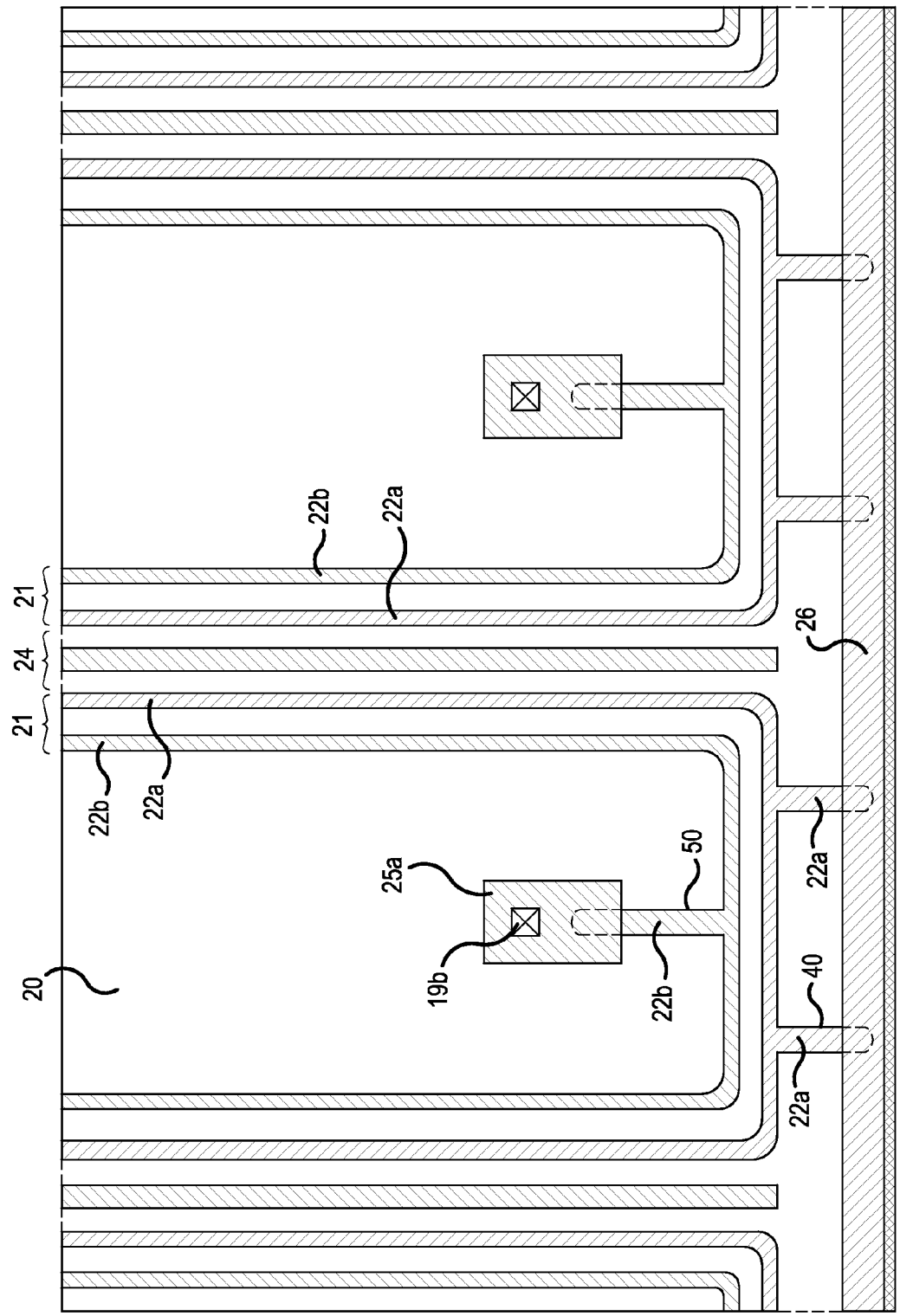
FIG. 14 is a plan view illustrating the planar layout of a main portion of a semiconductor device according to Embodiment 3.

FIG. 14 is a plan view illustrating the planar layout of a main portion of a semiconductor device according to Embodiment 3. The semiconductor device according to Embodiment 3 differs from the semiconductor device according to Embodiment 1 in the number of second trenches 40 with respect to one third trench 50 and the position of the second trench 40. Specifically, in Embodiment 1, the second trench 40 faces the third trench 50 with the first trench 21 interposed therebetween. More specifically, the second trench 40 and the third trench 50 are arranged on the same straight line which traverses the first trench 21. In contrast, in Embodiment 3, as shown in FIG. 14, two second trenches 40 are arranged with respect to one third trench 50, and the second trench 40 and the third trench 50 do not directly face each other, with the first trench 21 interposed therebetween. Specifically, for example, a plurality of second trenches 40 are provided with respect to one third trench 50 and a portion of the p base region 30 which is interposed between adjacent second trenches 40 faces the third trench 50, with the first trench 21 interposed therebetween.

As described above, according to Embodiment 3, since the semiconductor device has the same cross-sectional structure as the semiconductor device according to Embodiment 1, it is possible to obtain the same effect as that in Embodiment 1.

Embodiment 4

Figure 15:
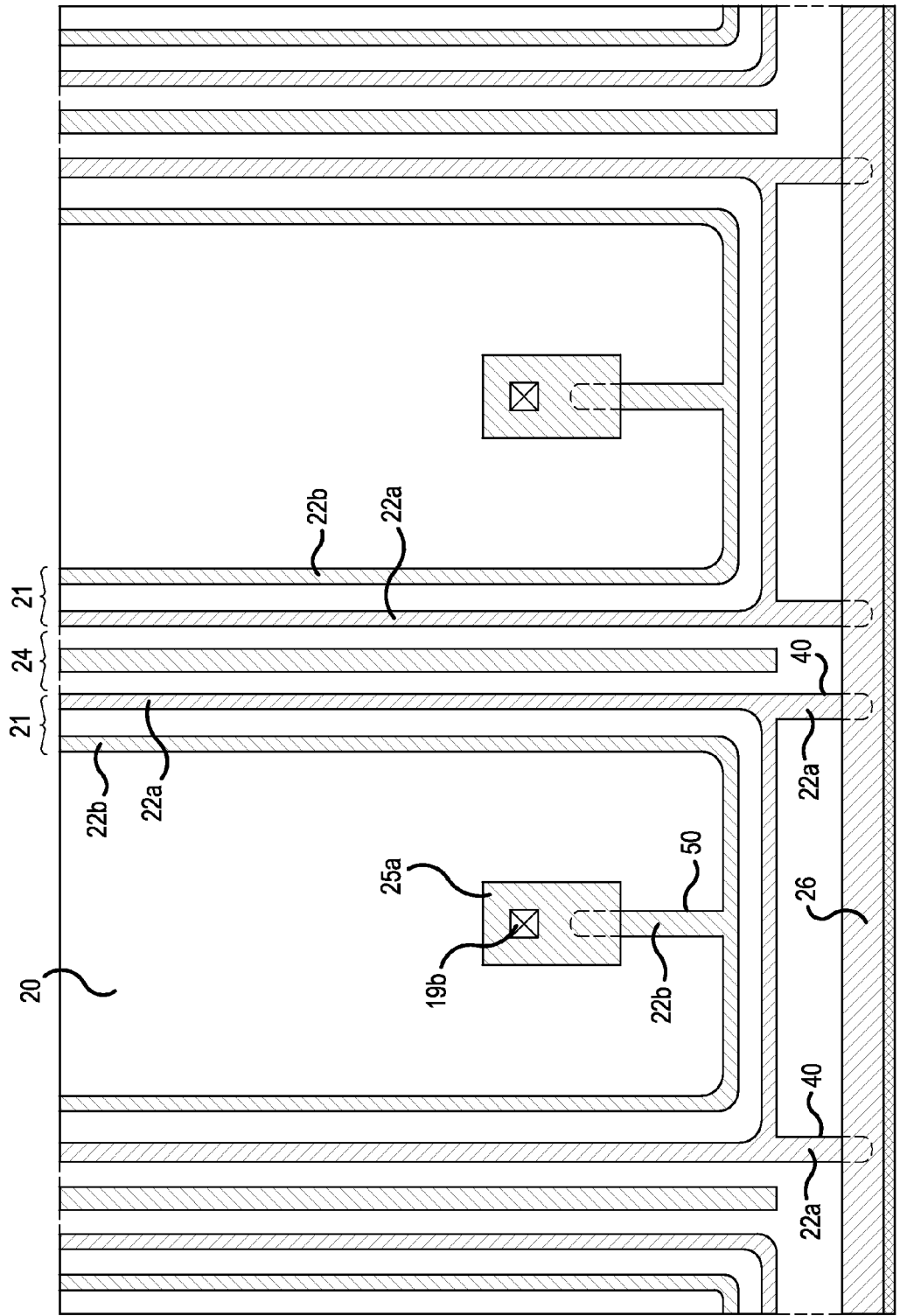
FIG. 15 is a plan view illustrating the planar layout of a main portion of a semiconductor device according to Embodiment 4.

FIG. 15 is a plan view illustrating the planar layout of a main portion of a semiconductor device according to Embodiment 4. The semiconductor device according to Embodiment 4 differs from the semiconductor device according to Embodiment 3 in the position of the second trench 40. Specifically, in Embodiment 4, as shown in FIG. 15, two second trenches 40 are provided with respect to one third trench 50, each of the second trenches 40 is provided at the corners of the first trench 21, and the second trench 40 faces a third trench 50, with a first trench 21 interposed therebetween. More specifically, for example, a plurality of second trenches 40 are provided with respect to one third trench 50 so as to be connected to the outer side wall of the corners of the first trench 21 and a portion of a p base region 30 which is interposed between adjacent second trenches 40 faces the third trench 50, with the first trench 21 interposed therebetween.

As described above, according to Embodiment 4, since the semiconductor device has the same cross-sectional structure as the semiconductor device according to Embodiment 1, it is possible to obtain the same effect in Embodiment 1.

Embodiment 5

Figure 16:
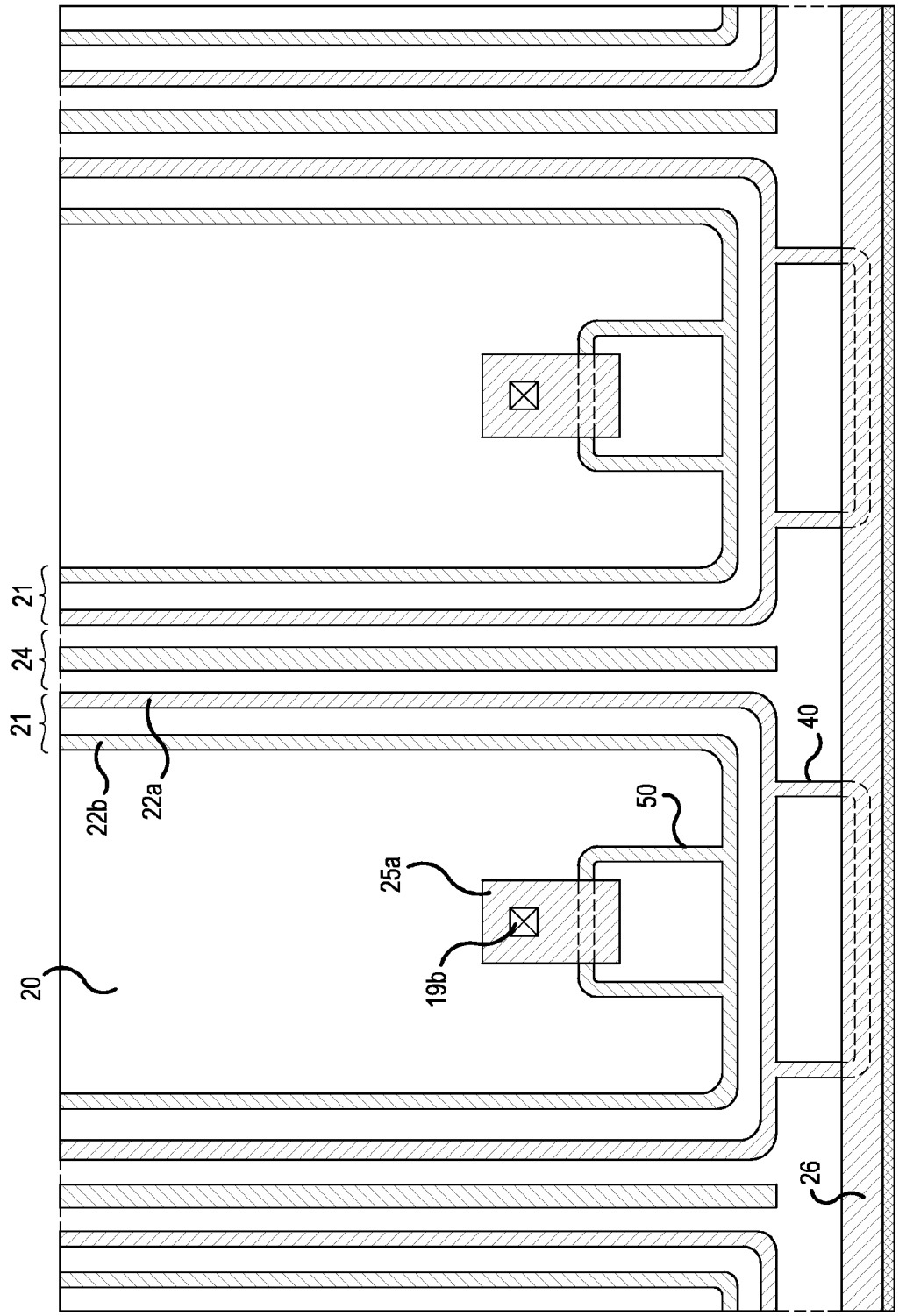
FIG. 16 is a plan view illustrating the planar layout of a main portion of a semiconductor device according to Embodiment 5.

FIG. 16 is a plan view illustrating the planar layout of a main portion of a semiconductor device according to Embodiment 5. The semiconductor device according to Embodiment 5 differs from the semiconductor device according to Embodiment 2 in the planar shape of the second trench 40. Specifically, in Embodiment 2, as shown in FIG. 12, the second trench 40 is arranged symmetrically to the third trench 50, with the first trench 21 interposed between. In contrast, in Embodiment 5, as shown in FIG. 16, the second trench 40 is arranged outside the third trench 50 in a plan view and the second trench 40 and the third trench 50 do not directly face each other or are not symmetrical to each other, with the first trench 21 interposed therebetween. More specifically, the length of a side wall portion of the first trench 21 in the planar shape of a ring (or a substantially rectangular ring) formed by the second trench 40 and a portion of the first trench 21 is greater than the length of a side wall portion of the first trench 21 in the planar shape of a ring shape (or a substantially rectangular ring) formed by the third trench 50 and a portion of the first trench 21.

As described above, according to Embodiment 5, since the semiconductor device has the same cross-sectional structure the semiconductor device according to Embodiment 1, it is possible to obtain the same effect as that in Embodiments 1 and 2.

Embodiment 6

Figure 17:
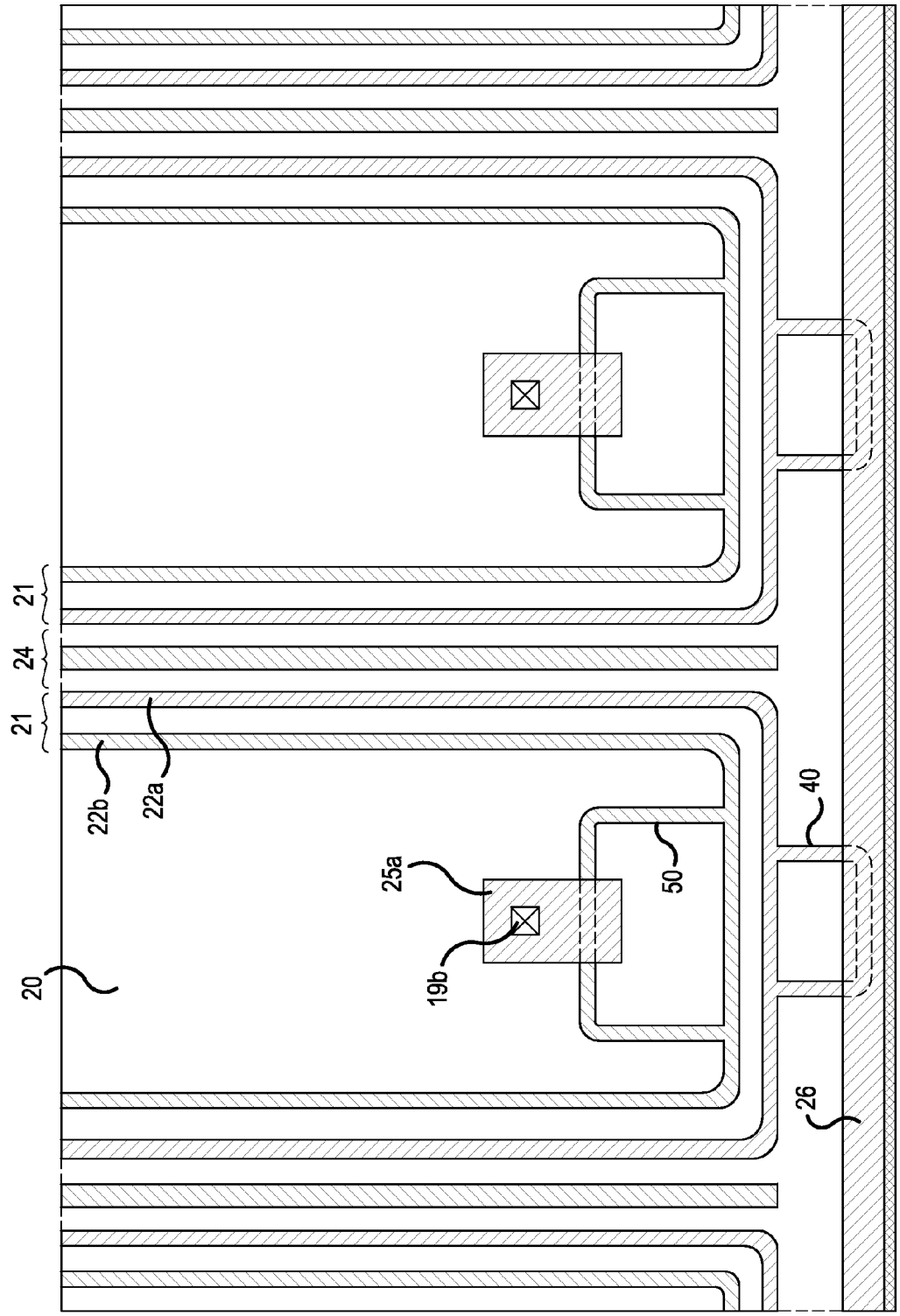
FIG. 17 is a plan view illustrating the planar layout of a main portion of a semiconductor device according to Embodiment 6.

FIG. 17 is a plan view illustrating the planar layout of a main portion of a semiconductor device according to Embodiment 6. The semiconductor device according to Embodiment 6 differs from the semiconductor device according to Embodiment 2 in the planar shape of the third trench 50. Specifically, in Embodiment 6, as shown in FIG. 17, the third trench 50 is arranged outside the second trench 40 in a plan view and the second trench 40 and the third trench 50 do not directly face each other or are not symmetrical to each other, with the first trench 21 interposed therebetween. More specifically, the length of a side wall portion of the first trench 21 in the planar shape of a ring (or a substantially rectangular ring) formed by the third trench 50 and a portion of the first trench 21 is greater than the length of a side wall portion of the first trench 21 in the planar shape of a ring shape (or a substantially rectangular ring) formed by the second trench 40 and a portion of the first trench 21.

As described above, according to Embodiment 6, since the semiconductor device has the same cross-sectional structure as the semiconductor device according to Embodiment 1, it is possible to obtain the same effect as that in Embodiments 1 and 2.

Embodiment 7

Next, the structure of a semiconductor device according to Embodiment 7 will be described. The semiconductor device according to Embodiment 7 differs from the semiconductor device according to Embodiment 1 in the shape of a connection portion (first connection portion) between the first trench 21 and the second trench 40 and the shape of a connection portion (second connection portion) between the first trench 21 and the third trench 50. Specifically, at the portion where the first trench 21 and the second trench 40 intersect each other and at the position where the first trench 21 and the third trench 50 intersect each other, the corners of the connection portion formed by the first trench 21 and the second trench 40 and the corners of the connection portion formed by the first trench 21 and the third trench 50 are chamfered and have a round shape (not shown). That is, the first connection portions between the side wall of the first trench 21 and the side wall of the second trench 40 are chamfered and have a round shape. The second connection portions between the side wall of the first trench 21 and the side wall of the third trench 50 are chamfered and have a round shape.

Only one of the first connection portion and the second connection portion may have a round shape. For example, in FIG. 1, any one of four connection portions including the first connection portions and the second connection portions may have a round shape. In this case, it is possible to prevent the electric field from being concentrated in the vicinity of the first connection portions between the side wall of the first trench 21 and the side wall of the second trench 40 and the second connection portions between the side wall of the first trench 21 and the side wall of the third trench 50.

In order to prevent the concentration of the electric field in the vicinity of the first connection portion and the second connection portion, preferably, the first connection portion and the second connection portion are not covered with the emitter electrode 25 and the gate pad 28, respectively.

As described above, according to Embodiment 7, since the semiconductor device has the same cross-sectional structure as the semiconductor device according to Embodiment 1, it is possible to obtain the same effect as that in Embodiments 1 and 2. In addition, according to Embodiment 7, it is possible to prevent the electric field from being concentrated in the vicinity of the first connection portions between the side wall of the first trench 21 and the side wall of the second trench 40 and the second connection portions between the side wall of the first trench 21 and the side wall of the third trench 50.

In the above-described embodiments of the invention, the IGBT is given as an example of the semiconductor device. However, the invention is not limited to the above-described embodiments, but can be applied to various types of semiconductor devices with the MOS gate structure. In the above-described embodiments, the first conductivity type is an n type and the second conductivity type is a p type. However, the invention is not limited thereto. The first conductivity type may be a p type and the second conductivity type is an n type. In this case, the same effect as described above is obtained.

As described above, the semiconductor device according to the invention is used for a power semiconductor device that is used in, for example, a power conversion device.

Thus, a semiconductor device and method for its manufacture been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

EXPLANATIONS OF LETTERS OR NUMERALS

2 $n^-$ drift layer
10 interlayer insulating film
15 insulating film
15a first insulating film
15b second insulating film
16 third insulating film
19a first contact hole
19b second contact hole
19c third contact hole
20 floating p region
21 first trench
22 polysilicon layer
22a first gate electrode
22b shield electrode
25 emitter electrode
25a emitter polysilicon layer
26 gate runner
27 emitter contact region
28 gate pad
30 p base region
31 $n^+$ emitter region
40 second trench
50 third trench
60 p layer

What is claimed is:
1. A semiconductor device comprising:
 a first trench that is provided in a surface layer of a semiconductor layer of a first conductivity type;
 a second trench that is connected to one side wall of the first trench;
 a third trench that is connected to the other side wall of the first trench;
 a base region of a second conductivity type that is selectively formed in the surface layer of the semiconductor layer along the one side wall of the first trench at a depth that is less than the depth of the first trench;
 an emitter region that is formed in a surface layer of the base region so as to come into contact with the side wall of the first trench;
 a floating potential region of the second conductivity type that is selectively formed in the surface layer of the semiconductor layer along the other side wall of the first trench;
 a first insulating film that is provided along the one side wall of the first trench and an inner wall of the second trench;
 a second insulating film that is provided along the other side wall of the first trench and an inner wall of the third trench;
 a first gate electrode that is provided on the first insulating film along the one side wall of the first trench and is provided in the second trench;
 a shield electrode that is provided on the second insulating film along the other side wall of the first trench and is provided in the third trench;
 a third insulating film that fills a space between the first gate electrode and the shield electrode in the first trench;
 a gate runner that is an extended portion of the second trench, has a portion which is provided on the first gate electrode, and is connected to the first gate electrode;
 an emitter polysilicon layer that is an extended portion of the third trench, has a portion which is provided on the shield electrode, and is connected to the shield electrode;
 an interlayer insulating film that covers the first gate electrode, the shield electrode, the emitter region, the gate runner, and the emitter polysilicon layer;
 a gate pad that is provided on the interlayer insulating film and is connected to the gate runner; and
 an emitter electrode that is provided on the interlayer insulating film so as to be separated from the gate pad and is connected to the emitter region, the base region, and the shield electrode.

2. The semiconductor device according to claim 1, wherein an opening width of the second trench and the third trench is less than an opening width of the first trench.

3. The semiconductor device according to claim 2, wherein an opening width of the first trench is greater than two times the thickness of the first gate electrode.

4. The semiconductor device according to claim 3, further comprising:
 a collector layer of the second conductivity type that is provided on a rear surface of the semiconductor; and
 a collector electrode that is provided on a surface of the collector layer.

5. The semiconductor device according to claim 2, further comprising:
 a collector layer of the second conductivity type that is provided on a rear surface of the semiconductor; and
 a collector electrode that is provided on a surface of the collector layer.

6. The semiconductor device according to claim 1, wherein the second trench and the third trench are arranged on the same straight line which traverses the first trench.

7. The semiconductor device according to claim 6, further comprising:

a collector layer of the second conductivity type that is provided on a rear surface of the semiconductor; and a collector electrode that is provided on a surface of the collector layer.

8. The semiconductor device according to claim 1, wherein a plurality of the second trenches are provided with respect to one third trench, and a portion of the base region which is interposed between adjacent second trenches faces the third trench, with the first trench interposed therebetween.

9. The semiconductor device according to claim 8, further comprising:

a collector layer of the second conductivity type that is provided on a rear surface of the semiconductor; and a collector electrode that is provided on a surface of the collector layer.

10. The semiconductor device according to claim 1, wherein the second trench and a portion of the first trench form a ring shape in a plan view, and the third trench and a portion of the first trench form a ring shape in a plan view.

11. The semiconductor device according to claim 10, further comprising:

a collector layer of the second conductivity type that is provided on a rear surface of the semiconductor; and a collector electrode that is provided on a surface of the collector layer.

12. The semiconductor device according to claim 1, wherein a first connection portion between the side wall of the first trench and a side wall of the second trench and a second connection portion between the side wall of the first trench and a side wall of the third trench are chamfered and have a round shape.

13. The semiconductor device according to claim 12, wherein the first connection portion and the second connection portion are not covered with the emitter electrode and the gate pad, respectively.

14. The semiconductor device according to claim 13, further comprising:

a collector layer of the second conductivity type that is provided on a rear surface of the semiconductor; and a collector electrode that is provided on a surface of the collector layer.

15. The semiconductor device according to claim 12, further comprising:

a collector layer of the second conductivity type that is provided on a rear surface of the semiconductor; and a collector electrode that is provided on a surface of the collector layer.

16. The semiconductor device according to claim 1, further comprising:

a collector layer of the second conductivity type that is provided on a rear surface of the semiconductor; and a collector electrode that is provided on a surface of the collector layer.

* * * * *